(12) United States Patent
Botkin et al.

(10) Patent No.: US 8,220,210 B2
(45) Date of Patent: Jul. 17, 2012

(54) PHOTOVOLTAIC MODULE AND MODULE ARRAYS

(75) Inventors: Jonathan Botkin, El Cerrito, CA (US);
Simon Graves, Berkeley, CA (US); Carl J. S. Lenox, Oakland, CA (US);
Matthew Culligan, Berkeley, CA (US);
Matt Danning, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 140 days.

(21) Appl. No.: 12/492,802

(22) Filed: Jun. 26, 2009

(65) Prior Publication Data
US 2009/0320907 A1 Dec. 31, 2009

Related U.S. Application Data

(60) Provisional application No. 61/076,492, filed on Jun. 27, 2008.

(51) Int. Cl.
*E04D 13/18* (2006.01)
*H01L 31/042* (2006.01)

(52) U.S. Cl. ........ 52/173.3; 136/251; 136/244; 126/623

(58) Field of Classification Search ................. 52/173.3, 52/582.1, 584.1, 653.1, 656.1; 136/230, 136/251, 244; 126/623, 704; 248/910, 237, 248/346.01
See application file for complete search history.

(56) References Cited

U.S. PATENT DOCUMENTS

| | | | |
|---|---|---|---|
| 4,089,705 A | | 5/1978 | Rubin |
| 4,139,399 A | * | 2/1979 | Lindmayer ................. 136/251 |
| 4,196,720 A | | 4/1980 | ElDifrawi et al. |
| 4,226,256 A | * | 10/1980 | Hawley ....................... 136/244 |
| 4,378,006 A | | 3/1983 | Hawley |
| 4,392,009 A | * | 7/1983 | Napoli ....................... 136/251 |
| 4,421,943 A | | 12/1983 | Withjack |
| 4,677,248 A | | 6/1987 | Lacey |

(Continued)

FOREIGN PATENT DOCUMENTS

DE 20120983 4/2002

(Continued)

OTHER PUBLICATIONS

SunLink Corporation, brochure entitled "PV Module Mounting System for Flat Roofs & Ground Mounts"; ©2000-2007; 12 pgs.

(Continued)

*Primary Examiner* — Robert Canfield
*Assistant Examiner* — Babajide Demuren
(74) *Attorney, Agent, or Firm* — Blakely Sokoloff Taylor & Zafman LLP

(57) ABSTRACT

A photovoltaic (PV) module including a PV device and a frame. The PV device has a PV laminate defining a perimeter and a major plane. The frame is assembled to and encases the laminate perimeter, and includes leading, trailing, and side frame members, and an arm that forms a support face opposite the laminate. The support face is adapted for placement against a horizontal installation surface, to support and orient the laminate in a non-parallel or tilted arrangement. Upon final assembly, the laminate and the frame combine to define a unitary structure. The frame can orient the laminate at an angle in the range of 3°-7° from horizontal, and can be entirely formed of a polymeric material. Optionally, the arm incorporates integral feature(s) that facilitate interconnection with corresponding features of a second, identically formed PV module.

36 Claims, 17 Drawing Sheets

U.S. PATENT DOCUMENTS

| | | | | |
|---|---|---|---|---|
| 4,707,204 A * | 11/1987 | Heeg | ............................... | 156/91 |
| 5,316,592 A | 5/1994 | Dinwoodie | | |
| 5,497,587 A * | 3/1996 | Hirai et al. | .................... | 52/173.3 |
| 5,571,338 A | 11/1996 | Kadonome et al. | | |
| 5,672,036 A | 9/1997 | Medal | | |
| 6,046,399 A | 4/2000 | Kapner | | |
| 6,105,316 A | 8/2000 | Bottger et al. | | |
| 6,111,189 A * | 8/2000 | Garvison et al. | ............... | 136/244 |
| 6,148,570 A | 11/2000 | Dinwoodie et al. | | |
| 6,201,181 B1 | 3/2001 | Azzam et al. | | |
| 6,453,629 B1 * | 9/2002 | Nakazima et al. | ........... | 52/173.3 |
| 6,537,006 B1 | 3/2003 | Clark | | |
| 6,570,084 B2 | 5/2003 | Dinwoodie | | |
| 6,606,823 B1 | 8/2003 | McDonough et al. | | |
| 6,617,507 B2 | 9/2003 | Mapes et al. | | |
| 6,619,003 B2 * | 9/2003 | Von Arx et al. | ................. | 52/222 |
| 6,672,018 B2 | 1/2004 | Shingleton | | |
| 6,703,555 B2 * | 3/2004 | Takabayashi et al. | ........ | 136/244 |
| 6,803,515 B2 * | 10/2004 | Itoyama et al. | ............... | 136/251 |
| 6,809,251 B2 | 10/2004 | Dinwoodie | | |
| 6,809,253 B2 | 10/2004 | Dinwoodie | | |
| 6,959,517 B2 * | 11/2005 | Poddany et al. | ............. | 52/173.3 |
| 7,155,870 B2 | 1/2007 | Almy | | |
| 7,178,295 B2 | 2/2007 | Dinwoodie | | |
| 7,297,866 B2 | 11/2007 | Aschenbrenner | | |
| 7,531,741 B1 | 5/2009 | Melton et al. | | |
| 2003/0094193 A1 | 5/2003 | Mapes et al. | | |
| 2004/0094194 A1 | 5/2004 | Aldoretta et al. | | |
| 2004/0128923 A1 | 7/2004 | Moulder | | |
| 2004/0154655 A1 * | 8/2004 | Tanaka | ........................ | 136/244 |
| 2004/0261955 A1 | 12/2004 | Shingleton et al. | | |
| 2005/0126621 A1 | 6/2005 | Dinwoodie et al. | | |
| 2005/0217716 A1 | 10/2005 | Masuda et al. | | |
| 2006/0053706 A1 * | 3/2006 | Russell | ........................ | 52/173.3 |
| 2006/0090789 A1 * | 5/2006 | Thompson | .................... | 136/246 |
| 2006/0196128 A1 | 9/2006 | Duke | | |
| 2007/0144575 A1 | 6/2007 | Mascolo et al. | | |
| 2007/0151594 A1 | 7/2007 | Mascolo et al. | | |
| 2007/0196195 A1 | 8/2007 | Lin | | |
| 2008/0087320 A1 | 4/2008 | Mapes et al. | | |
| 2009/0113822 A1 | 5/2009 | Patrina et al. | | |
| 2009/0242014 A1 * | 10/2009 | Leary | ........................... | 136/251 |

FOREIGN PATENT DOCUMENTS

| | | |
|---|---|---|
| DE | 102005039495 | 3/2007 |
| DE | 102006026297 | 8/2007 |
| EP | 0698928 | 2/1996 |
| EP | 1548846 | 6/2005 |
| EP | 2031324 | 3/2009 |
| JP | 11324234 | 11/1999 |
| JP | 2006274591 A1 | 10/2006 |
| NL | 1029160 | 12/2006 |
| WO | WO-03098126 | 11/2003 |
| WO | 2007/079382 A2 | 7/2007 |
| WO | WO-2007103882 | 9/2007 |
| WO | WO-2008108909 | 9/2008 |

OTHER PUBLICATIONS

SunLink brochure entitled "PV Module Mounting System"; undated; 4 pgs.

Sunpower Corporation brochure entitled "T10 Solar Roof Tile"; available at www.sunpowercorp.com; 2 pgs.

International Search Report and WO for PCT Patent Application No. PCT/US2009/049082 Mailed Nov. 25, 2010, 15 Pages.

International Search Report and Written Opinion for International Patent Application No. PCT/US2009/049098, Mailed Dec. 14, 2010, 10 pages.

International Preliminary Report on Patentability for International Patent Application No. PCT/US2009/049098, Mailed Jan. 13, 2011, 7 pages.

International Preliminary Report on Patentability for International Patent Application No. PCT/US2009/049095, Mailed Jan. 13, 2011, 11 pages.

International Search Report and Written Opinion for International Patent Application No. PCT/US2009/049090, Mailed May 4, 2010, 14 pages.

International Preliminary Report on Patentability for International Patent Application No. PCT/US2009/049090, Mailed Jan. 13, 2011, 9 pages.

International Preliminary Report on Patentability for International Patent Application No. PCT/US2009/049082, Mailed Jan. 13, 2011, 10 pages.

International Search Report and Written Opinion for International Patent Application No. PCT/US2009/049075, Mailed Apr. 14, 2010, 15 pages.

International Preliminary Report on Patentability for International Patent Application No. PCT/US2009/049075, Mailed Jan. 13, 2011, 9 pages.

Non-Final Office Action for U.S. Appl. No. 12/492,640, Mailed Dec. 13, 2010, 21 pages.

Non-Final Office Action for U.S. Appl. No. 12/492,680, Mailed Jan. 4, 2011, 19 pages.

Non-Final Office Action for U.S. Appl. No. 12/492,838, mailed May 4, 2010, 21 pages.

Final Office Action for U.S. Appl. No. 10/492,838, mailed Sep. 13, 2010, 13 pages.

Advisory Action for U.S. Appl. No. 10/492,838, mailed Nov. 22, 2010, 3 pages.

Kyocera webpage announcement "Kyocera to Release a New Dirt-Free Module in September"; dated Aug. 4, 2005; 2 pages.

Akamatsu et al., JP11-324234, Machine Translation, Nov. 26, 1999, 7 pages.

Office Action from U.S. Appl. No. 12/492,729 mailed Jun. 20, 2011, 22 pgs.

* cited by examiner

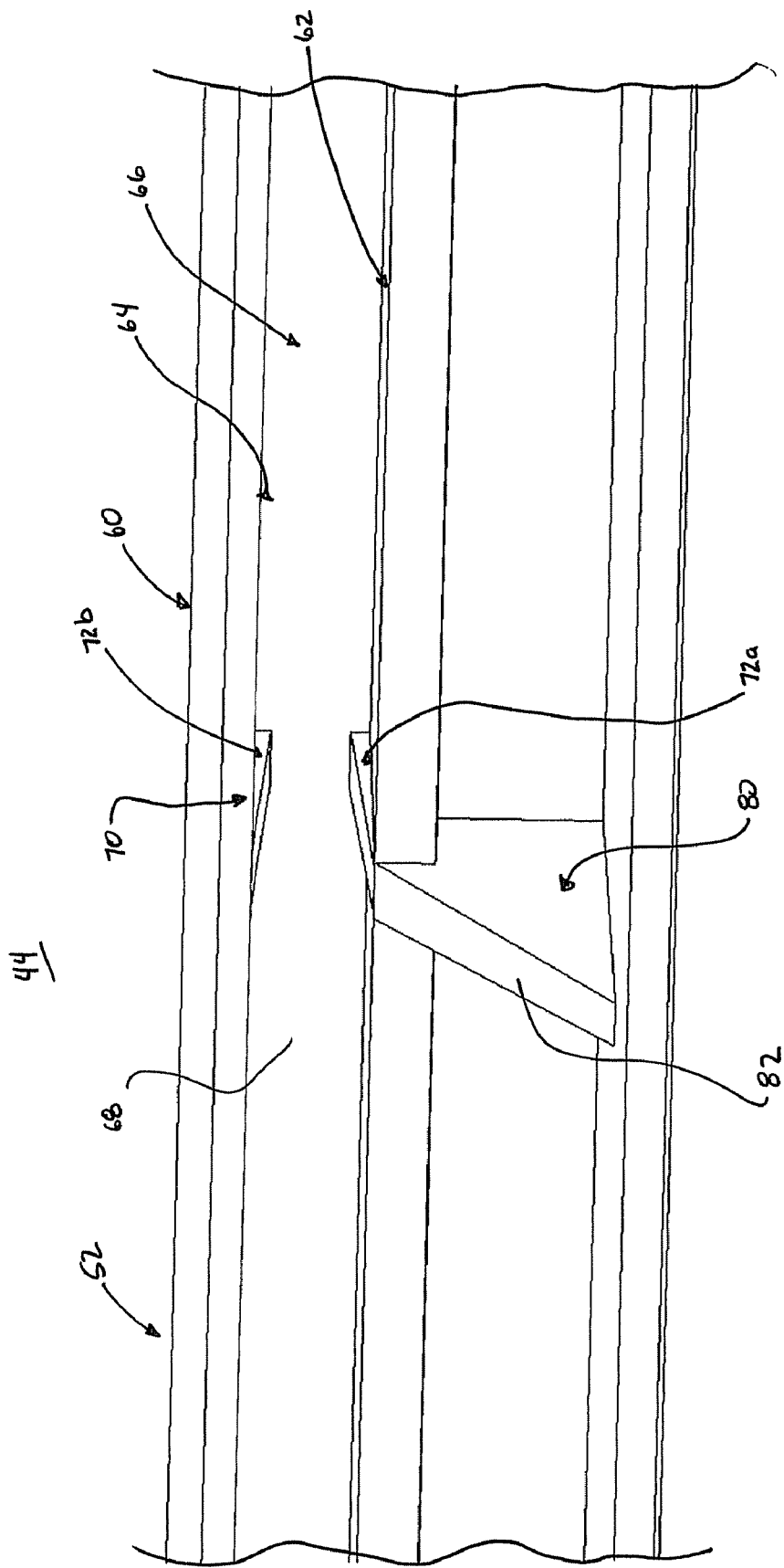

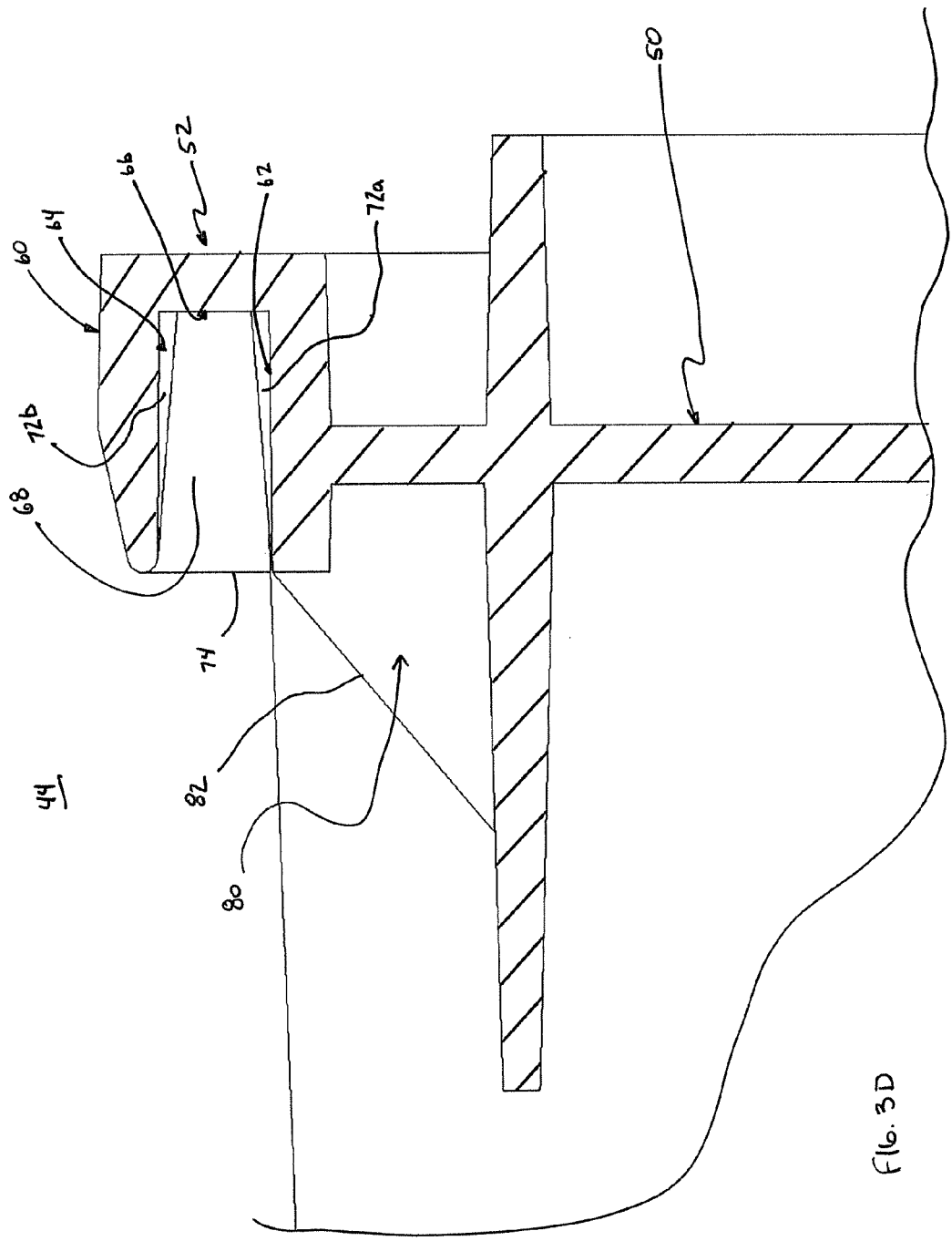

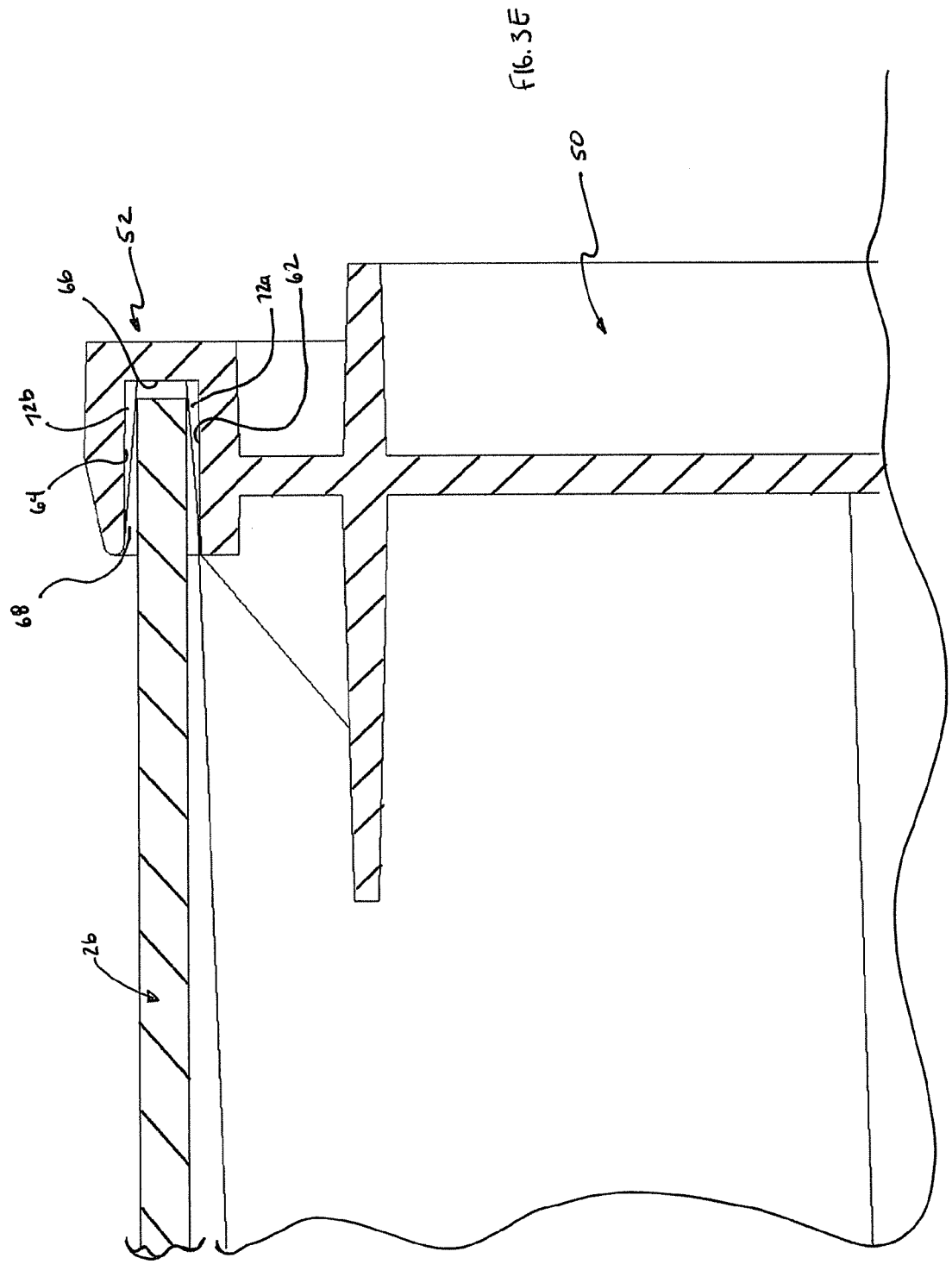

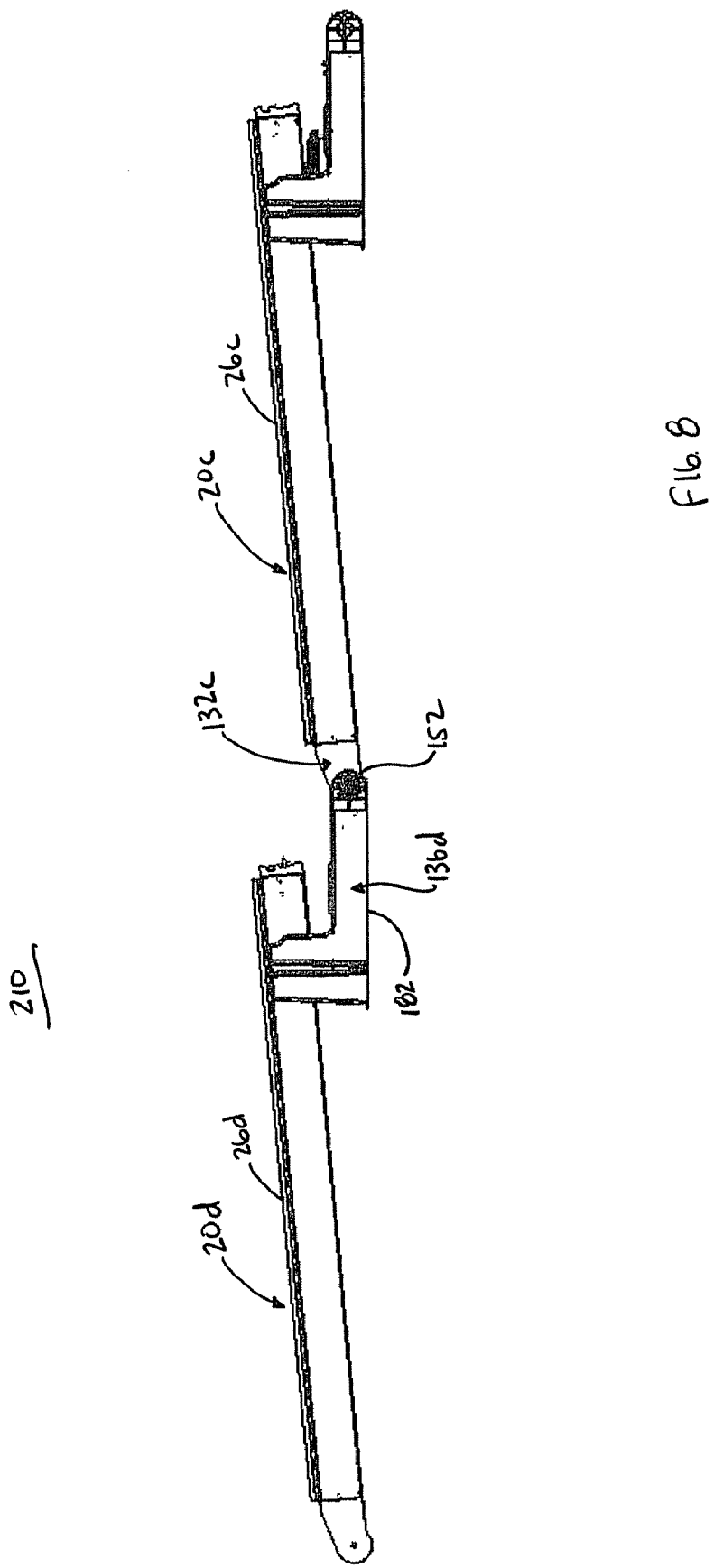

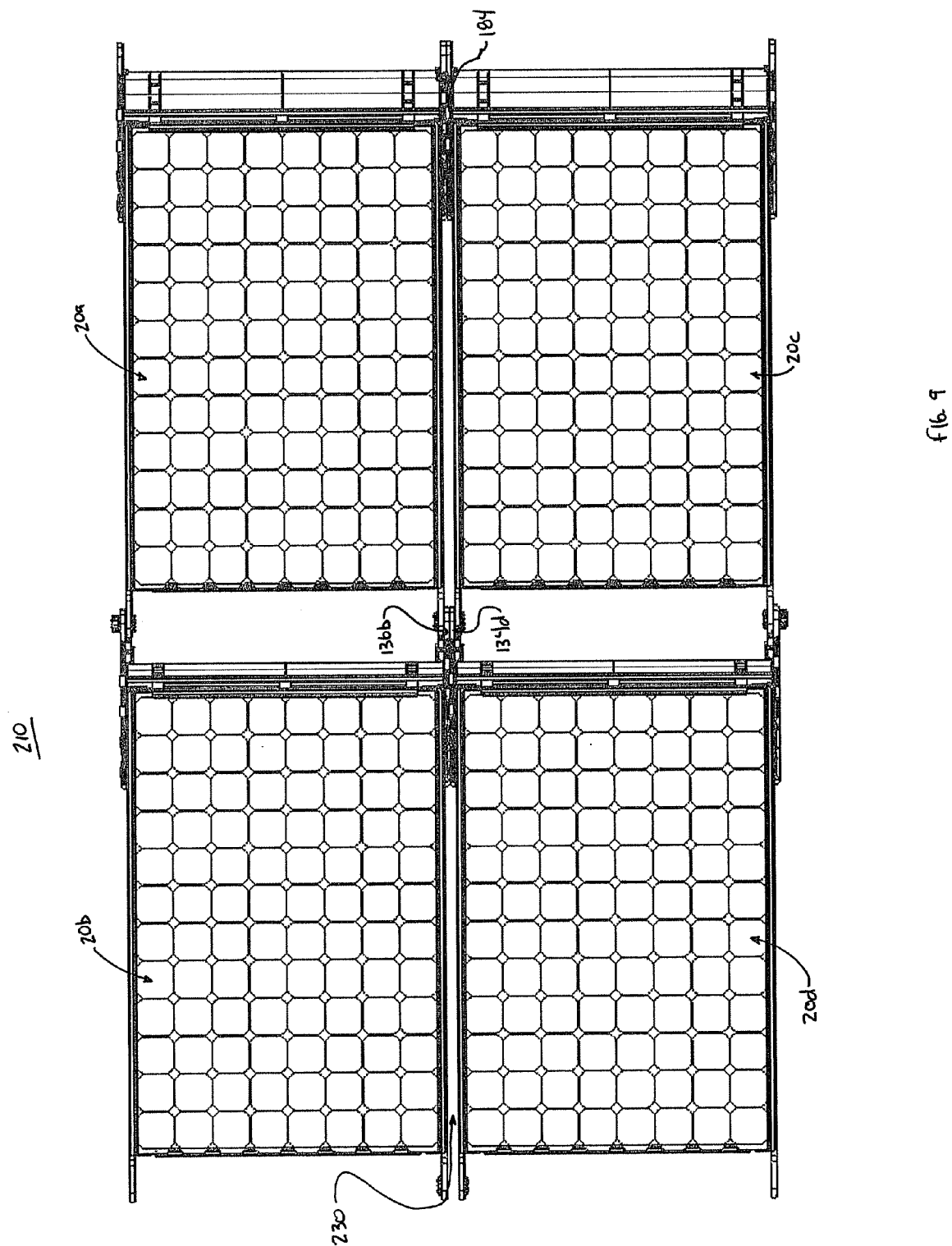

PHOTOVOLTAIC MODULE AND MODULE ARRAYS

PRIORITY DATA

This application claims priority under 35 U.S.C. §119(e)(1) to U.S. Provisional Patent Application Ser. No. 61/076,492, filed Jun. 27, 2008, entitled "Photovoltaic Module and Module Arrays", and the entire teachings of which are incorporated herein by reference.

CROSS-REFERENCE TO RELATED APPLICATIONS

This application also relates to U.S. Application Ser. No. 61/076,475 entitled "Ballasted Photovoltaic Module and Module Arrays"; U.S. Application Ser. No. 61/076,479 entitled "Photovoltaic Module Kit Including Connector Assembly for Non-Penetrating Array Installation"; U.S. Application Ser. No. 61/076,486 entitled "Photovoltaic Module with Removable Wind Deflector"; and U.S. Application Ser. No. 61/076,497 entitled "Photovoltaic Module with Drainage Frame"; all of which were filed on even date herewith and the teachings of each of which are incorporated herein by reference.

STATEMENT REGARDING FEDERALLY SPONSORED RESEARCH OR DEVELOPMENT

This invention was made with Government support under Contract No. DE-FC36-07GO17043 awarded by the United States Department of Energy. The Government has certain rights in this invention.

BACKGROUND

The present disclosure relates to solar roof tiles. More particularly, it relates to photovoltaic modules adapted for rapid installation as part of an arrayed, rooftop photovoltaic system.

Solar power has long been viewed as an important, highly viable, alternative energy source. To this end, substantial efforts and investments have been made to develop and improve upon solar energy collection technology. Of particular interest are industrial- or commercial-type applications in which relatively significant amounts of solar energy can be collected and utilized in supplementing or satisfying power needs.

Solar photovoltaic technology is generally viewed as the optimal approach for large scale solar energy collection, and can be used as a primary and/or secondary (or supplemental) energy source. In general terms, solar photovoltaic systems (or simply "photovoltaic systems") employ solar panels made of silicon or other materials (e.g., III-V cells such as GaAs) to convert sunlight into electricity. More particularly, photovoltaic systems typically include a plurality of photovoltaic (PV) modules (or "solar tiles") interconnected with wiring to one (or more) appropriate electrical components (e.g., switches, inverters, junction boxes, etc.). The PV module conventionally consists of a PV laminate or panel generally forming an assembly of crystalline or amorphous semiconductor devices electrically interconnected and encapsulated. One or more electrical conductors are carried by the PV laminate through which the solar-generated current is conducted.

Regardless of an exact construction of the PV laminate, most PV applications entail interconnecting an array of PV modules at the installation site in a location where sunlight is readily present. This is especially true for commercial or industrial applications in which a relatively large number of PV modules are desirable for generating substantial amounts of energy, with the rooftop of the commercial building providing a convenient surface at which the PV modules can be placed. As a point of reference, many commercial buildings have large, flat roofs that are inherently conducive to placement of a significant array of PV modules. In fact, utilizing an existing rooftop as the PV module installation site represents the most efficient use of space in that the building/rooftop structure is already in existence, and thus minimizes the need for additional, separate structures necessary for supporting the PV modules. While rooftop installation is thus highly viable, certain environment constraints must be addressed. For example, the PV laminate is generally flat or planar; thus, if simply "laid" on an otherwise flat rooftop, the PV laminate may not be positioned/oriented to collect a maximum amount of sunlight throughout the day. Instead, it is desirable to tilt the PV laminate at a slight angle relative to the rooftop (i.e., toward the southern sky for northern hemisphere installations, or toward the northern sky for southern hemisphere installations). Further, rooftop-installed PV modules are oftentimes subjected to windy conditions, a concern that is further heightened where the PV laminate is tilted relative to the rooftop as described above.

In light of the above, conventional PV module installation techniques have included physically interconnecting each individual PV module of module array directly with, or into, the existing rooftop structure. For example, some PV module configurations have included multiple frame members that are physically attached to the rooftop via bolts driven through the rooftop. While this technique may provide a more rigid mounting of the PV module to the rooftop, it is a time-consuming process, and inherently permanently damages the rooftop. Further, because holes are formed into the rooftop, the likelihood of water damage is highly prevalent. More recently, PV module configurations have been devised for commercial, flat rooftop installation sites in which the arrayed PV modules are self-maintained relative to the rooftop in a non-penetrating manner. More particularly, the PV modules are interconnected to one another via a series of separate, auxiliary components, with a combined weight of the interconnected array (and possibly additional ballast and/or wind-deflecting fairings or "wind deflectors" mounted to one or more of the PV modules at the installation site) serving to collectively offset wind-generated forces.

While the non-penetrating PV module array approach has been well-received, certain drawbacks may still exist. For example, a large number of parts are required, along with the logistical management of these parts, to facilitate non-penetrating, interconnected mounting of an array of PV modules. In this regard, the arrangement of PV modules (e.g., number, location, and type) will vary for each installation site. Thus, the number and types of requisite, auxiliary mounting components will also vary, and must be accurately ordered and delivered to the installation site with the PV modules. Thus, considerable upfront planning is necessary. Along these same lines, installation requirements for several non-penetrating PV module formats entail wind-deflecting auxiliary components (e.g., a perimeter curb) that are configured or sized as a direct function of the resultant perimeter shape or geometry of the arrayed PV modules. Once again, substantial upfront planning must be performed in order to ensure that these wind-deflecting components, as well as other installation components, are provided to the installation site in forms that are properly sized and shaped in accordance with the expected shape of the PV module array. Clearly, any errors in the upfront planning, miscommunication of the installation parameters, incorrect part list ordering, etc., can negatively impact and overtly delay the installation process. Further, where the auxiliary installation components are packaged apart from the PV modules, as is common in the industry, it is highly difficult at best for the installation personnel to quickly recognize whether ordering and/or shipping errors have occurred. Instead, these errors only become evident during the actual installation process, and typically cannot be quickly rectified. Similarly, fairly significant labor and expertise (and thus cost) is required to install non-penetrating PV modules at a commercial building's rooftop. Finally, considerable expense is necessitated by the handling and disposal of the shipping materials required in providing all of the PV modules, as well as all of the auxiliary mounting components and related equipment.

PV module-based solar energy represents an extremely promising technology for reducing the reliance of commercial or industrial businesses upon conventional, natural resource-based energy. To be competitive with traditional sources of municipal power, however, the costs associated with solar PV systems should desirably be reduced wherever possible. Thus, a need exists for a PV module and related PV module systems or arrays that are readily mounted to commercial rooftops in a non-penetrating fashion.

SUMMARY

Some aspects in accordance with principles of the present disclosure relate to a photovoltaic (PV) module including a PV device and a frame. The PV device includes a PV laminate having a perimeter and a front face defining a major plane. The frame is assembled to and encases the perimeter of the PV laminate. In this regard, the frame includes opposing, leading and trailing frame members, and opposing, first and second side frame members. Further, an arm is provided that projects from one of the frame members and forms a support face opposite the front face of the PV laminate, with the support face being adapted for placement against a separate installation surface, thereby supporting and orienting the PV laminate relative to the installation surface. With this in mind, a plane of the support face and the major plane of the PV laminate are non-parallel (e.g., the PV laminate is tilted relative to the support face). Regardless, upon final assembly (e.g., factory assembly), the PV laminate and the frame combine to define a unitary structure. In some embodiments, the frame is configured such that when the support face is placed on a flat surface, the PV laminate is oriented at a non-parallel angle relative to the flat surface, for example, at an angle in the range of 3°-7°. In other embodiments, the unitary structure feature of the PV module entails that the frame cannot be disassembled from the PV laminate without destroying at least one of the frame members. In yet other embodiments, the frame members are entirely formed of a polymeric material. In yet other embodiments, one or more of the frame members incorporates integral features that facilitate interconnection with corresponding features of a second, identically formed PV module.

Other aspects in accordance with principles of the present disclosure relate to a method of manufacturing a PV module. The method includes providing a PV device including a PV laminate having a perimeter at a front face defining a major plane. A frame is also provided including leading, trailing, and first and second side frame members. Further, the frame includes an arm projecting from one of the frame members and defining a support face. The PV laminate is mounted to the frame members such that the frame members encase the perimeter. Further, the frame members are mounted to one another. Upon final assembly (e.g., factory assembly), the PV laminate and the frame combine to define a unitary structure, with a plane of the support face and the major plane of the PV laminate being non-parallel. In some embodiments, the frame members are simultaneously mounted to one another and the PV laminate, thereby simplifying the overall manufacturing process.

Other aspects in accordance with principles of the present disclosure relate to a photovoltaic module system kit for non-penetrating installation at a substantially flat surface, such as a commercial building rooftop. The system kit has at least two PV modules each including a PV device and a frame. The PV device includes a PV laminate. The frame is assembled to and surrounds the PV laminate to define a unitary structure. Further, the frame includes an arm forming a planar support face for placement against a separate installation surface so as to tilt the PV laminate relative to the installation surface. The support face and the PV laminate are non-parallel to effectuate tilted arrangement upon non-penetrating installation to a flat rooftop. In kit form appropriate for shipping, the frame of the first PV module is nested on top of the frame of the second PV module, whereby the arm(s) carried by the frames do not impede the nested relationship.

BRIEF DESCRIPTION OF THE DRAWINGS

FIG. 3C is an enlarged, perspective view of a segment of the frame portion of FIGS. 3A and 3B;

FIG. 3D is a simplified, cross-sectional view of the frame portion of FIGS. 3A and 3B;

FIG. 3E illustrates assembly of a photovoltaic laminate to the frame portion of FIG. 3D;

FIG. 4B is an interior, perspective view of the frame portions of FIG. 4A;

FIG. 8 is a side view of the array of FIG. 7;

DETAILED DESCRIPTION

Figure 1A:
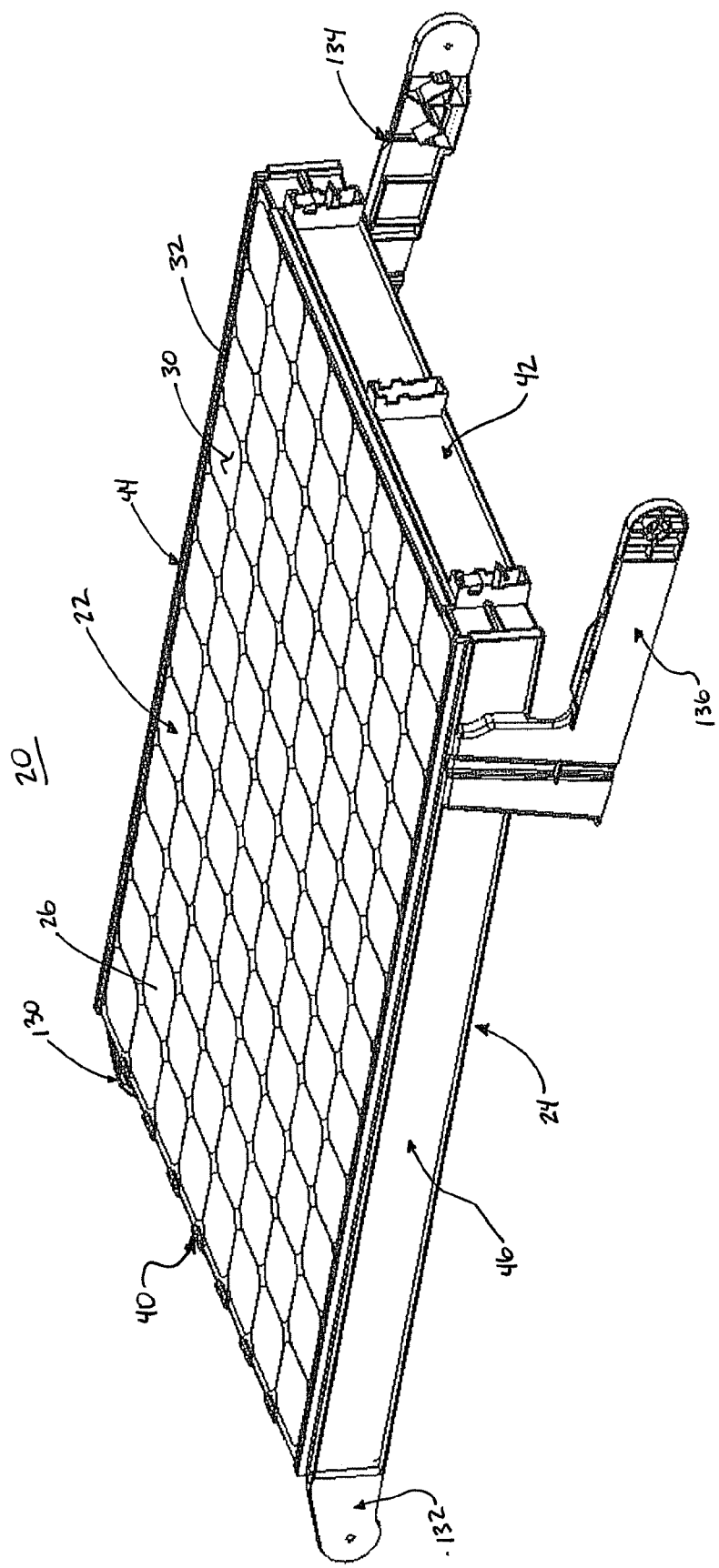
FIG. 1A is a top, rear perspective view of a photovoltaic module in accordance with principles of the present disclosure.
Figure 1B:
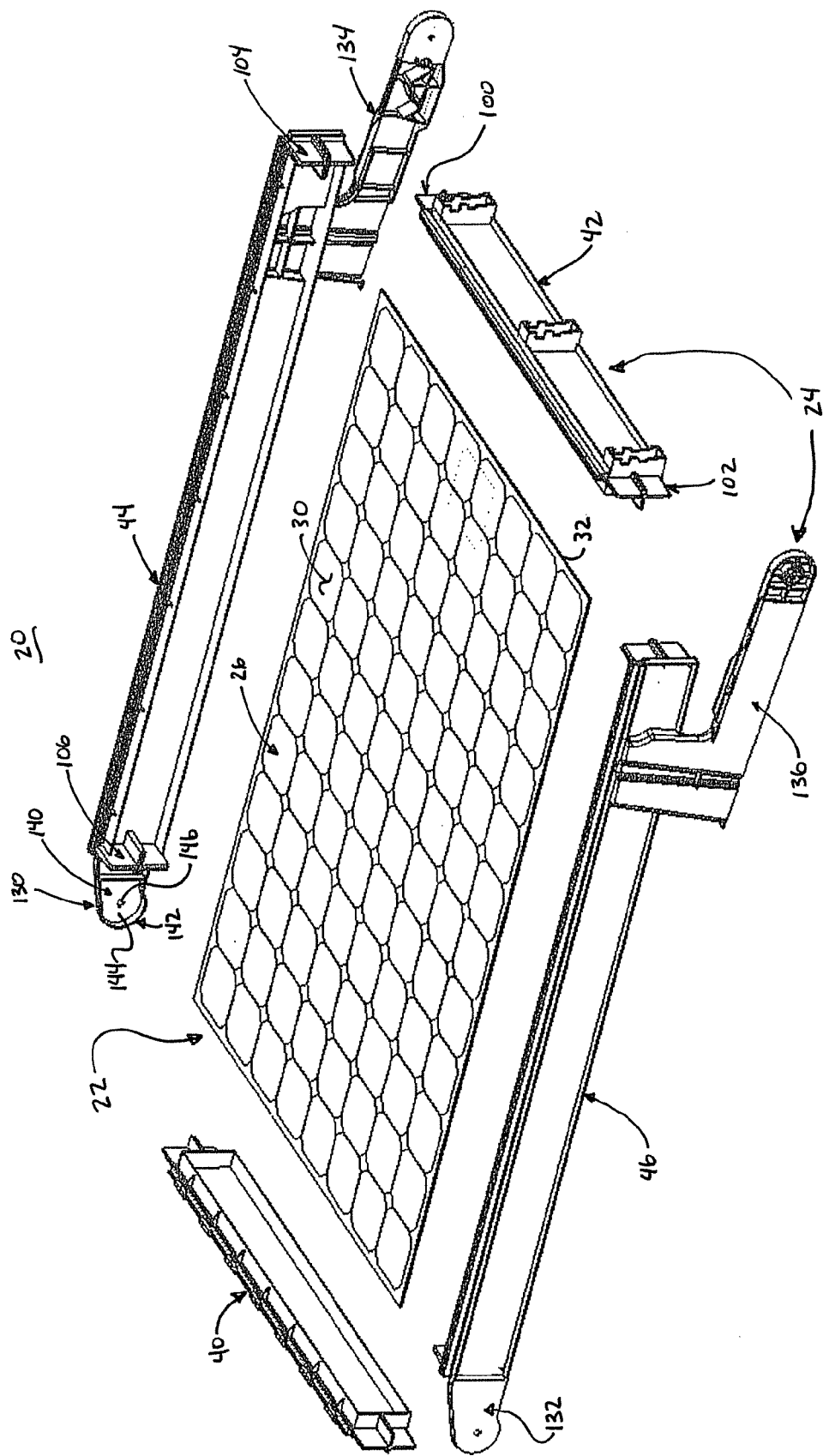
FIG. 1B is an exploded view of the photovoltaic module of FIG. 1A.

One embodiment of a photovoltaic (PV) module 20 in accordance with principles of the present disclosure is shown in FIGS. 1A and 1B. The PV module 20 includes a PV device 22 (referenced generally) and a frame 24. Details on the various components are provided below. In general terms, however, the PV device 22 includes a PV laminate 26 that is encased by the frame 24. In this regard, the frame 24 provides one or more support faces that effectuate a tilted orientation of the PV laminate 26 relative to a flat installation surface (e.g., a flat rooftop). Further, in some embodiments, the frame 24 incorporates one or more features that facilitate mounting of the PV module 20 to one or more similarly constructed PV modules. Regardless, the frame 24 and the PV laminate 26 are assembled to one another to form or define a unitary structure. With this configuration, the PV module 20 is highly amenable to non-penetrating, commercial rooftop installations in which a minimal number of additional parts are required for effectuating mounting of multiple ones of the PV modules 20 as part of a PV system array. This, in turn, greatly simplifies the installation process, for example in terms of labor, parts, and upfront planning, while greatly reducing shipping and handling costs. Benefits are realized in the installation of the PV modules 20 to any substantially flat surface (e.g., maximum pitch of 2:12), including commercial rooftop, residential rooftop, and ground mount applications.

The PV device 22, including the PV laminate 26, can assume a wide variety of forms currently known or in the future developed appropriate for use as a solar photovoltaic device. In general terms, the PV laminate 26 consists of an array of photovoltaic cells. A glass laminate may be placed over the photovoltaic cells for environmental protection. In some embodiments, the photovoltaic cells advantageously comprise backside-contact cells, such as those of the type available from SunPower Corp., of San Jose, Calif. As a point of reference, in backside-contact cells, wirings leading to external electrical circuits are coupled on the backside of the cell (i.e., the side facing away from the sun upon installation) for increased area for solar collection. Backside-contact cells are also disclosed in U.S. Pat. Nos. 5,053,083 and 4,927,770, which are both incorporated herein by reference in their entirety. Other types of photovoltaic cells may also be used without detracting from the merits of the present disclosure. For example, the photovoltaic cells can incorporate thin film technology, such as silicon thin films, non-silicon devices (e.g., III-V cells including GaAs), etc. Thus, while not shown in the figures, in some embodiments the PV device 22 can include one or more components in addition to the PV laminate 26, such as wiring or other electrical components.

Regardless of an exact construction, the PV laminate 26 can be described as defining a front face 30 and a perimeter 32 (referenced generally in FIGS. 1A and 1B). As a point of reference, additional components (where provided) of the PV device 22 are conventionally located at or along a back face of the PV laminate 26, with the back face being hidden in the view of FIGS. 1A and 1B.

Figure 2:
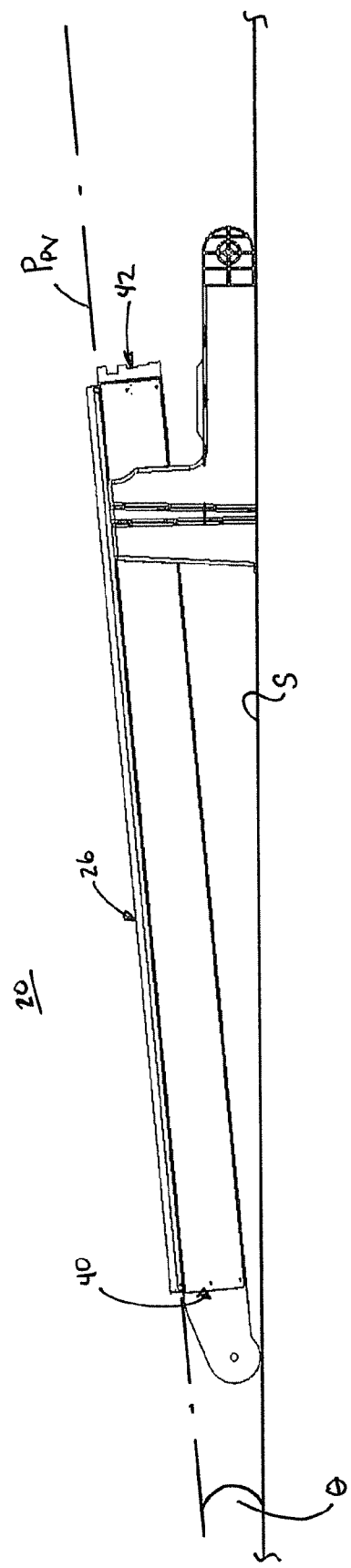
FIG. 2 is a side view of the photovoltaic module of FIG. 1A mounted to an installation surface.

With the above understanding of the PV device 22, and in particular the PV laminate 26, in mind, the frame 24 includes a leading frame member 40, a trailing frame member 42, a first side frame member 44, and a second side frame member 46. As described below, the frame 24 incorporates one or more additional features that facilitate arrangement of the PV laminate 26 at a desired orientation (e.g., tilted) relative to a substantially flat surface such as a rooftop. By way of further explanation, FIG. 2 provides a simplified illustration of the PV module 20 relative to a relatively flat, horizontal surface S. Though hidden in the view of FIG. 2, a location of the PV laminate 26 is generally indicated, as is a plane $P_{PV}$ of the PV laminate 26 that is otherwise established by the front face 30 (FIGS. 1A and 1B). With this in mind, and relative to the arrangement of FIG. 2, the frame 24 supports the PV laminate 26 relative to the flat surface S at a slope or tilt angle θ. The tilt angle θ can otherwise be defined as an included angle formed between the PV laminate plane $P_{PV}$ and a plane of the flat surface S. With this in mind, the frame 24 is configured to support the PV laminate 26 at a tilt angle θ in the range of 1°-30°, in some embodiments in the range of 3°-7°, and yet other embodiments at 5°. As a point of reference, with tilted PV solar collection installations, the PV laminate 26 is desirably positioned so as to face or tilt southward (in northern hemisphere installations). Given this typical installation orientation, then, the leading frame member 40 can thus be generally referred to as a south frame member, and the trailing frame member 42 referred to as a north frame member. Returning to FIGS. 1A and 1B, and consistent with these directional designations, the first side frame member 44 can be referred to as a west frame member, whereas the second side member 46 can be referred to as an east frame member.

The frame members 40-46 can assume a variety of forms appropriate for encasing the perimeter 32 of the PV laminate 26, as well as establishing the desired tilt angle θ (FIG. 2). In some embodiments, the frame members 40-46 are separately formed, and subsequently assembled to one another and the PV laminate 26 in a manner generating a unitary structure upon final construction.

Figure 3A:
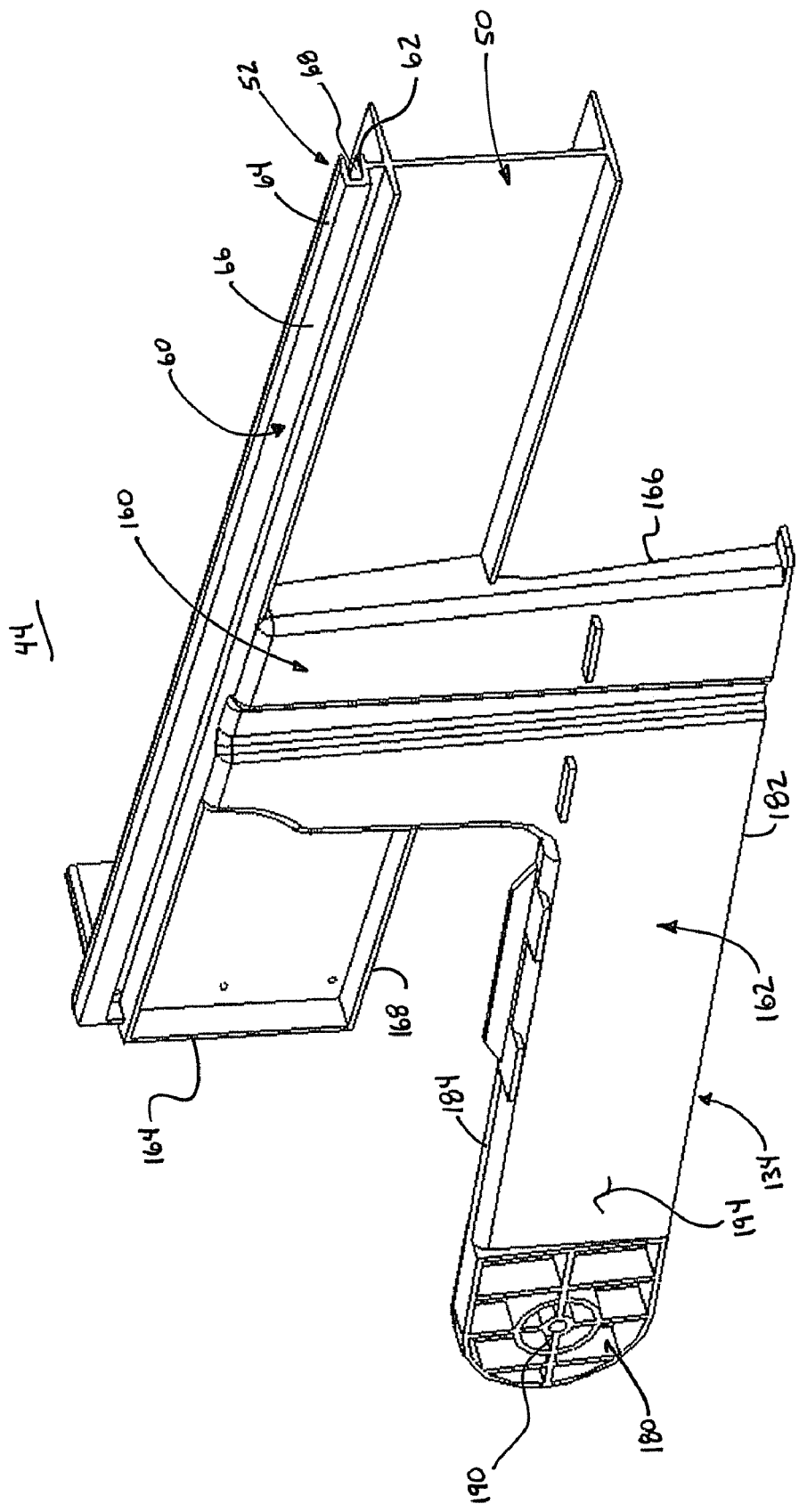
FIG. 3A is an exterior, perspective view of a portion of a frame useful with the photovoltaic module of FIGS. 1A and 1B.
Figure 3B:
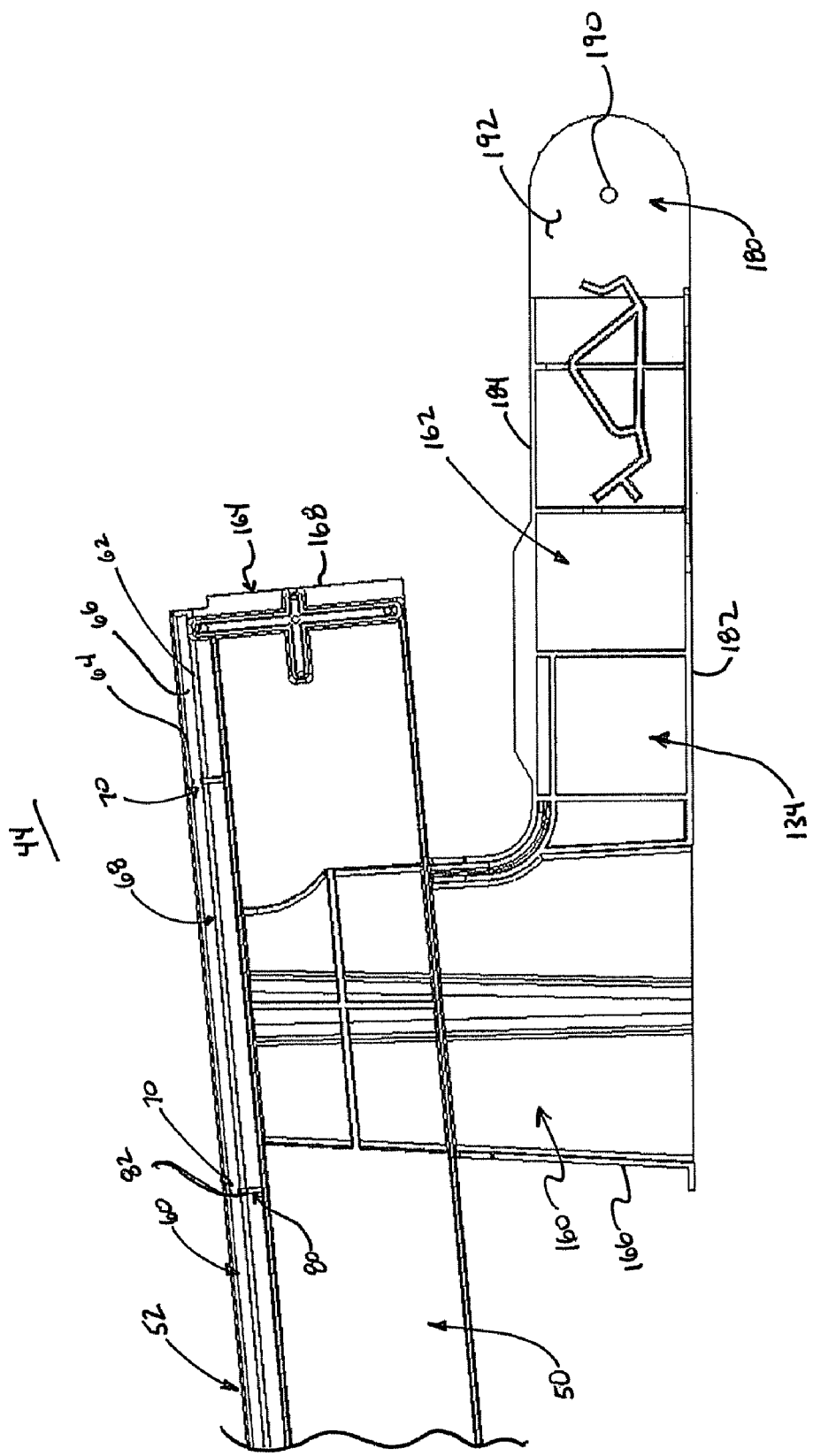
FIG. 3B is an interior plan view of the frame portion of FIG. 3A.

Each of the frame members 40-46 can incorporate, in some embodiments, identical features that promote assembly to the PV laminate 26. FIGS. 3A and 3B illustrate examples of these features relative to the first side frame member 44. In particular, the first side frame member 44 generally includes a frame body 50 and a bracket assembly 52. The frame body 50 can assume a variety of forms or shapes, and in some embodiments is akin to an I-beam in cross-section as reflected in FIG. 3A. Regardless, the bracket assembly 52 projects upwardly (relative to the orientation of FIGS. 3A and 3B) from the frame body 50 and includes a C-shaped bracket 60 that defines or is defined by a lower surface 62, an upper surface 64, and an end surface 66. The lower surface 62 is formed proximate the frame body 50, and the upper surface 64 is formed opposite the lower surface 62. The end surface 66 interconnects the lower and upper surfaces 62, 64, with the surfaces combining to define a channel 68 sized to receive the PV laminate 26 (FIG. 1B). More particularly, the channel 68 is sized to receive a corresponding edge of the PV laminate 26, and an appropriate adhesive employed to permanently affix or bond the PV laminate 26 to the bracket 60.

A spacing between the lower and upper surfaces 62, 64 can be greater than an expected height or thickness of the PV laminate 26 (FIG. 1B), with the bracket assembly 52 further including a plurality of spaced guide features 70 adapted to centrally maintain the PV laminate 26 between the surfaces 62, 64 in some embodiments. One of the guide features 70 is shown in greater detail in FIG. 3C, and includes a lower guide tab 72a projecting from the lower surface 62, and an upper guide tab 72b projecting from the upper surface 64. The guide tabs 72a, 72b can be vertically aligned and having an increasing height or thickness in extension toward the end surface 66 as reflected by FIG. 3D. Thus, in a region of guide tabs 72a, 72b, the channel 68 tapers in height from an open end 74 to the end surface 66.

By correlating the guide tabs 72a, 72b with an expected thickness of the PV laminate 26, the bracket assembly 52 is adapted to quickly receive, and desirably position, the PV laminate 26 relative to the bracket 60 for subsequent adhesive bonding as shown in FIG. 3E. As a point of reference, FIG. 3E represents the PV laminate 26 in simplified form, and the PV laminate 26 can have various features not specifically illustrated but accounted for by the guide features 70 (e.g., the PV laminate 26 can taper in thickness toward the perimeter edge). Regardless, the PV laminate 26 is maintained within the channel 68, via the guide tabs 72a, 72b, at an off-set or spaced position relative to the surfaces 62-66. This off-set provides sufficient spacing within the channel 68 for receiving and maintaining an adequate volume of adhesive (not shown), such as an RTV silicone adhesive, otherwise used to bond the PV laminate 26 to the bracket 60 (and in particular the surfaces 62-66), with the PV laminate 26 being centered between the lower and upper surfaces 62, 64 in some embodiments.

Returning to FIGS. 3B and 3C, one or more of the frame members 40-46 (FIG. 1A) can include additional features that promote assembly with the PV laminate 26. For example, with respect to the first side frame member 44, the bracket assembly 52 can further include one or more ramps 80. The ramps 80 are laterally spaced from one another (e.g., aligned with respective ones of the guide features 70), and provide a ramp surface 82 extending from the frame body 50 to the lower surface 62 of the bracket 60. More particularly, the ramp surface 82 extends in an angular fashion downwardly and away from the lower surface 62, and provides a surface for guiding the PV laminate 26 (FIG. 3D) into the channel 68. Thus, assembly of the PV laminate 26 entails sliding an edge of the PV laminate along the surface 82 of the ramp(s) 80, with the ramp surface 82 directing the PV laminate 26 into the channel 68 via respective ones of the lower guide tabs 72a (FIG. 3C) as described above. Alternatively, a wide variety of other configurations can be employed to facilitate assembly of the frame 24 and the PV laminate 26 such that one or more of the above-described features can be omitted.

Returning to FIG. 1B, one or more or all of the frame members 40-46 can incorporate the I-beam shaped (or other shape) frame body 50 and/or bracket assembly 52 (FIG. 3A) described above. In addition, in some embodiments, the frame members 40-46 include or form connector fittings adapted to facilitate robust interconnection or assembly of the frame members 40-46 to one another. For example, the leading and trailing frame members 40, 42 can include or form identically, opposing male connectors 100, 102 (identified for the trailing frame member 42 in FIG. 1B), whereas each of the side frame members 44, 46 includes or forms opposing, first and second female connectors 104, 106 (identified for the first side frame member 44 in FIG. 1B). In general terms, each of the female connectors 104, 106 are configured to receive a corresponding one of the male connectors 100, 102 in a press fit-type relationship. Notably, the connector type (i.e., male or female) associated with each of the frame members 40-46 can vary (e.g., the leading frame member 40 can form two female connectors, or one female connector and one male connector) so long as a male/female connection pair is established at each of the frame member 40-46 intersections.

Figure 4A:
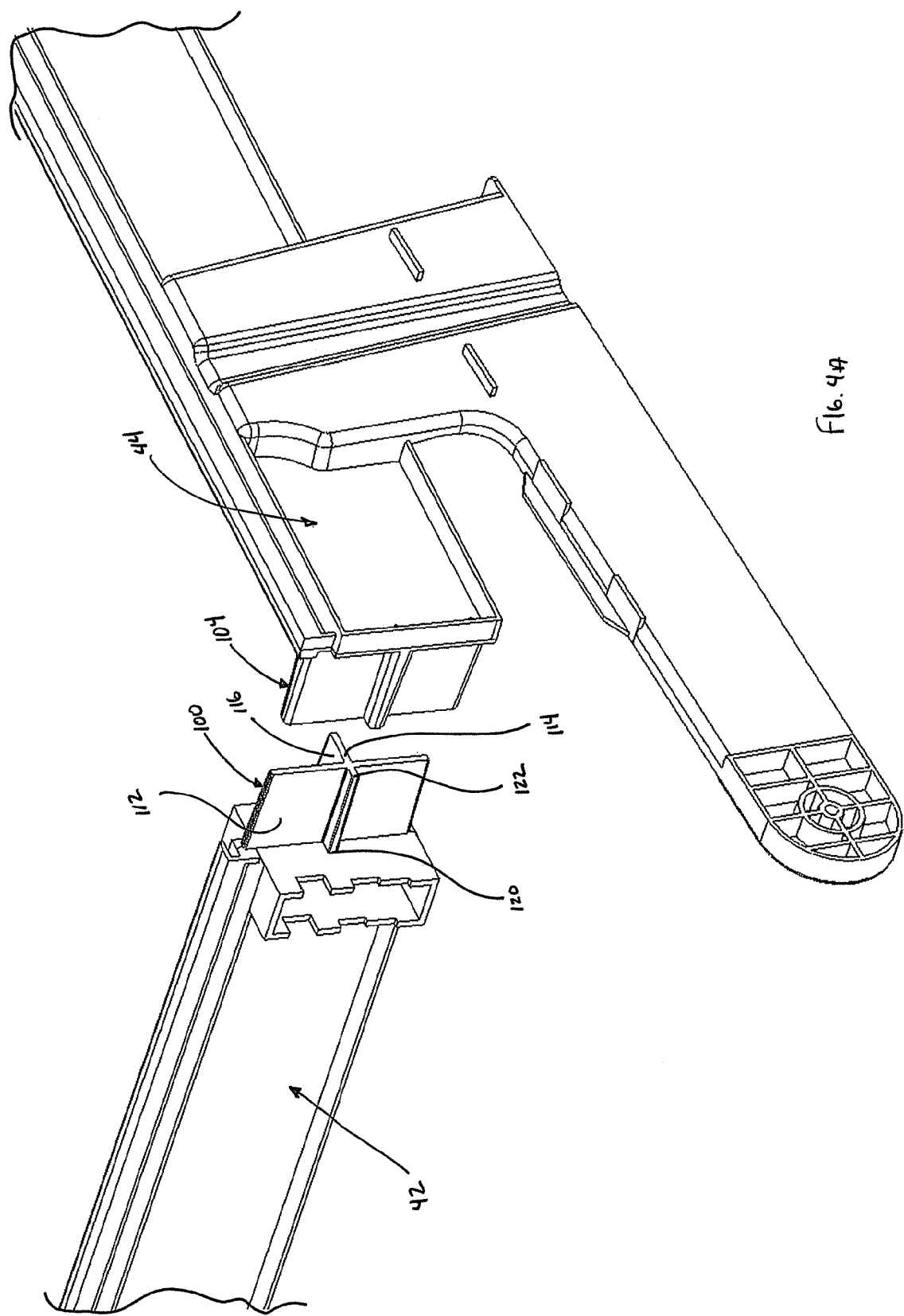
FIG. 4A is an exterior, perspective view of portions of the frame of FIG. 1B prior to assembly.

One embodiment of male and female connectors useful with the present disclosure is shown in FIGS. 4A and 4B, and in particular the male connector 100 of the trailing frame member 42 and the female connector 104 of the first side frame member 44. As illustrated, the male and female connectors 100, 104 have an identical shape, with the female connector 104 forming a receptacle 110 within which the male connector 100 is received. The corresponding shape associated with the connectors 100, 104 is generally cross-like, including a first segment 112 and a second segment 114 (identified for the male connector 100 in FIG. 4A). The segments 112, 114 extend in an approximately perpendicular fashion relative to one another, with the second segment 114 bisecting the first segment 112 in some embodiments. To provide enhanced support of the frame members 42, 44 relative to an interior of the frame 24 (i.e., a location of the PV laminate 26 (FIG. 1A)), the second segment 114 has an elongated, interior extension portion 116 (relative to the first segment 112). Further, in some constructions, at least the second segment 114 tapers in width from a base end 120 to a free end 122. Stated otherwise, a horizontal dimension of the second segment 114 at the base end 120 is greater than that at the free end 122. With this tapered construction, along with a corresponding shape defined by the female connectors 104 or 106, the male connector 100 is readily insertable into the receptacle 110 of the female connector 104. As the male connector 100 is further forced into the receptacle 110 (and/or vice-versa), a tapered press fit junction is achieved whereby the male connector 100 is frictionally locked within the female connector 104.

Returning to FIGS. 1A and 1B, the frame 24 can incorporate other designs to facilitate robust assembly of the frame members 40-46. However, at least with embodiments in which the frame members 40-46 are simultaneously assembled to the PV laminate 26 (via an adhesive) and to one another (e.g., via the connectors 100-106), the resultant assembly includes the PV laminate 26 and the frame 24 combining to define a unitary structure, with the frame members 40-46 completely "capturing" the PV laminate 26. As used through this specification, a "unitary structure" is in reference to a robust, unchanging assembly whereby the frame 24 cannot be disassembled from the PV laminate 26 without destroying at least one of the frame members 40-46. Notably, no additional components or specialized tools are required to effectuate complete, final assembly of the frame 24 and the PV laminate 26 in accordance with the above configurations. This presents significant savings in installation time as installers are not required to assemble component parts at the installation site to "complete" an individual PV module.

In addition to the frame members 40-46 described above, in some embodiments the frame 24 further includes one or more arms that facilitate desired orientation of the PV laminate 26 relative to an installation surface, as well as mounting of two or more PV modules 20 to one another. For example, in some embodiments, the frame 24 includes a first arm 130, a second arm 132, a third arm 134, and a fourth arm 136. The arms 130-136 can be formed by or otherwise associated with various ones of the frame members 40-46; with the construction of FIGS. 1A and 1B, for example, the first and third arms 130, 134 are provided as opposing extensions of (or from) the first side frame member 44, whereas the second and fourth arms 132, 136 are provided as opposing extensions of (or from) the second side frame member 46. Upon final assembly of the frame 24, the first and second arms 130, 132 project or extend longitudinally beyond (e.g., forward) the leading frame member 40, whereas the third and fourth arms 134, 136 project or extend longitudinally beyond (e.g., rearward) the trailing frame member 42 as shown in FIG. 1A.

The first and second arms 130, 132 can be of an identical construction, defining mirror images upon final construction of the frame 24. With this in mind, FIG. 1B illustrates the first arm 130 as including or defining a side wall 140 and a flange 142. The flange 142 projects inwardly from the side wall 140 along a perimeter thereof. The flange 142 effectively defines an overall width of the first arm 130. Further, extension of the flange 142 relative to the side wall 140 forms a mounting region 144 adapted to promote mounting with an arm (not shown) of a second PV module 20 as described below, with the mounting region 144 including or forming a bore 146 through the side wall 140. Regardless, the mounting region 144 is located longitudinally beyond (or is spaced from) not only the first side frame member 44, but also the leading frame member 40. This relationship is best reflected in FIG. 5 relative to the mounting region 144 of the second arm 132 relative to the leading frame member 40 (referenced generally).

Additional optional features of the first and second arms 130, 132 are further described with reference to FIG. 5, and in particular with respect to the second arm 132 that is otherwise visible in the view of FIG. 5. As shown, the second arm 132 extends outwardly and downwardly from the second side frame member 46 (and thus the leading frame member 40 that is otherwise generally referenced in FIG. 5). More particularly, forward (i.e., leftward relative to the orientation of FIG. 5) extension of the second arm 132 terminates at a leading surface 150. The leading surface 150 (along with an identical surface of the first arm 130 (FIG. 1B)) serves as the forward-most end of the frame 24, and thus of the PV module 20. As described below, this forward extension or dimension, along with the longitudinal positioning of the mounting region 144, is selected to correspond with a dimension of the fourth arm 136 (and a mounting region formed thereby) in establishing a desired end-to-end assembly of two PV modules 20. It will be understood that a similar relationship is established between the first arm 130 (FIG. 1B) and the third arm 134 (FIG. 1B) (again, as between two PV modules 20 positioned end-to-end).

Similarly, downward extension of the second arm 132 from the second side frame member 46 terminates at a bottom surface 152. The bottom surface 152 (along with an identical surface of the first arm 130 (FIG. 1B), as well as with one or more surfaces provided by the third and fourth arms 134, 136 as described below) serves as a bottom-most surface of the frame 24 and provides a support face at which the PV module 20 is supported relative to an installation surface. More particularly, downward extension of the first and second arms 130, 132 is selected in accordance with selected dimensional attributes of the third and fourth arms 134, 136 (described in greater detail below) to collectively create or define a common support face (e.g., including the bottom surface 152) that in turn dictates the desired, tilted orientation of the PV laminate 26 on a flat installation surface as mentioned above.

Figure 6:
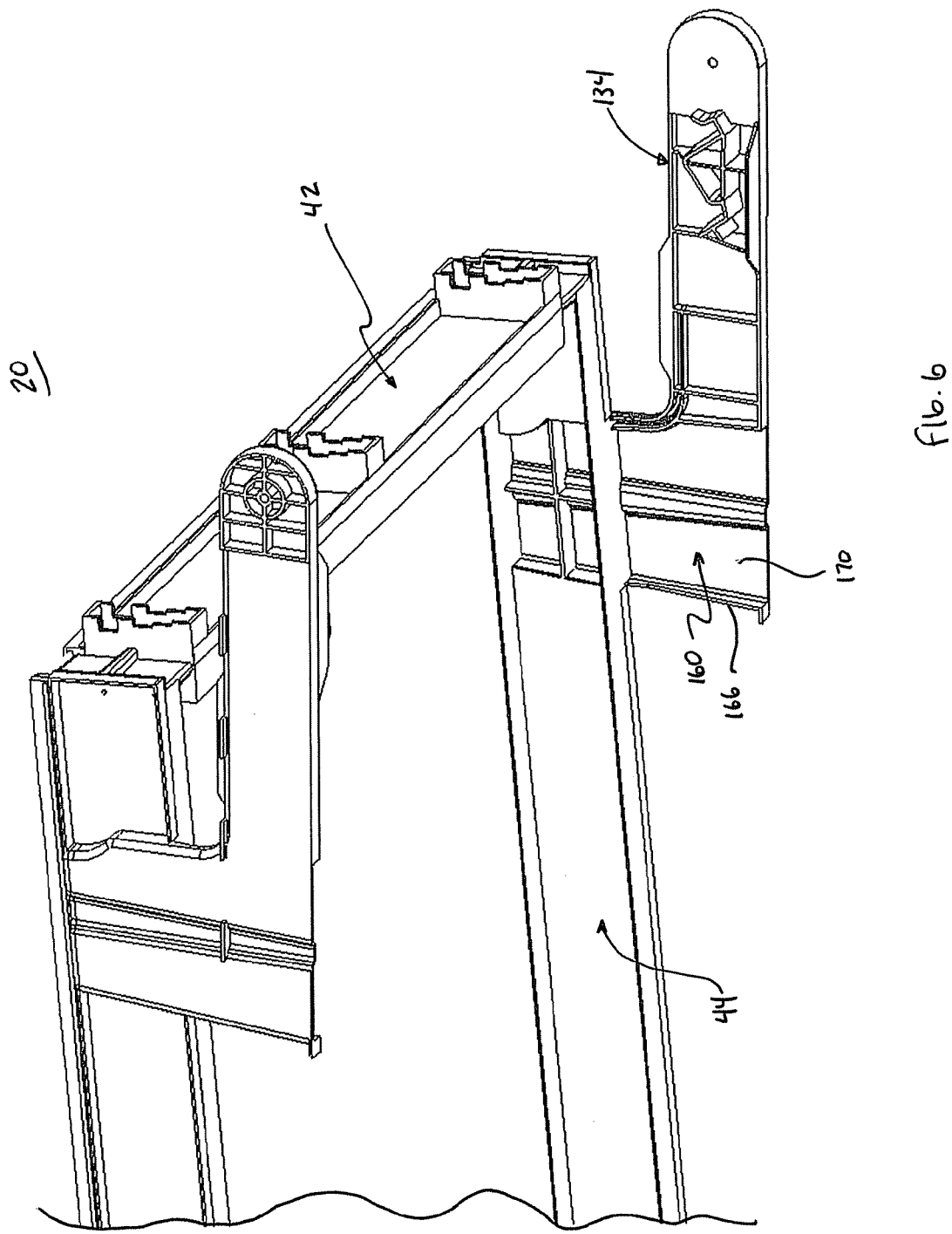
FIG. 6 is an interior, elevated perspective view of a portion of the photovoltaic module of FIG. 1A.

Returning to FIG. 1B, the third and fourth arms 134, 136 have an identical construction in some embodiments, forming mirror images of one another upon final construction of the frame 24. With this in mind, certain features of the third arm 134 are illustrated in FIGS. 3A and 3B. The third arm 134 can be L-shaped, and includes a shoulder 160 and a foot 162. The shoulder 160 can be formed with, and extends downwardly from and beyond, the first side frame member 44. As illustrated, a supportive interface between the shoulder 160 and the first side frame member 44 (and in particular the frame body 50) is established along a length of the first side frame member 44, proximate a trailing end 164 thereof. In this regard, downward extension of the shoulder 160 (as well as positioning of the foot 162 as described below) is such that an interior-most face 166 of the shoulder 160 is laterally offset from an exterior-most face 168 of the first side frame member 44. That is to say, an entirety of the portion of the third arm 134 extending from the first side frame member 44 is spatially positioned to the side of and away from the first side frame member 44. For reasons made clear below, this optional arrangement promotes desired spacing between two PV modules 20 when arranged side-by-side. Further, the transversely offset position of the third arm 134 (and the fourth arm 136) facilitated nested, stacked arrangement of multiple ones of the PV modules 20, for example during shipping and/or storage. Along these same lines, and as best shown in FIG. 6, the interior-most face 166 of the shoulder 160 (extending beyond the first side frame member 44) can form a trough 170 that further facilitates stacked, nested arrangements.

Returning to FIGS. 3A and 3B, the foot 162 extends rearwardly from the shoulder 160 and forms a mounting region 180, a lower surface 182, and an upper surface 184. The mounting region 180 is defined at a spatial location that is longitudinally spaced from the first side frame member 44 (and thus longitudinally spaced from the trailing frame member 42 upon final construction as shown in FIG. 1A). More particularly, longitudinal extension of the foot 162 from the shoulder 160 spatially positions the mounting region 180 rearward of not only the first side frame member 44, but also the trailing frame member 42. The selected extension dimensions of the foot 162 (and in particular the spatial coordinates of the mounting region 180) correlates with the extension dimensions associated with the first arm 130 (and in particular the spatial coordinates of the mounting region 144 (FIG. 1B)) as described above to establish desired, end-to-end spacing of two of the PV modules 20 when mounted to one another (it being understood that an identical relationship is established between the second and fourth arms 132, 136). With this in mind, the mounting region 180 can include a bore 190 extending between an interior face 192 and an exterior face 194.

Returning to FIG. 5, the lower surface 182 is relatively planar along a length of the foot 162, and establishes a desired orientation of the PV laminate 26 (referenced generally) via arrangement of the fourth arm 136 in extension from the second side frame member 46 (it being recalled that the third arm 134 (FIGS. 3A and 3B) has an identical construction in some embodiments). In particular, the lower surface 182 serves as a part of the PV module support face described above, and defines a plane $P_A$ that is non-parallel relative to the plane $P_{PV}$ of the PV laminate 26 (as otherwise spatially maintained by the frame members 40-46). Further, the plane $P_A$ of the lower surface 182 (as well as the identical plane defined the lower surface of the third arm 134 intersects the bottom surface 152 of the second arm 132 (as well as the identical bottom surface of the first arm 130 (FIG. 1B)). Thus, the arms 130-136 combine to spatially establish the desired, tilted orientation of the PV laminate 26 relative to a flat installation surface.

Figure 5:
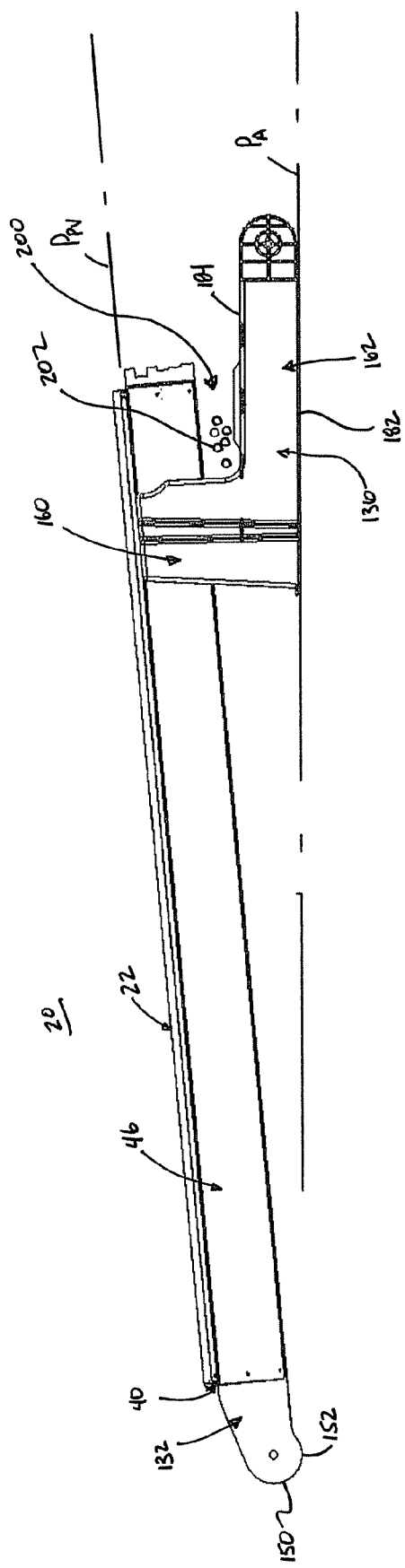
FIG. 5 is a side view of the photovoltaic module of FIG. 1A, including wiring associated therewith.

As mentioned above, the shoulder 160 extends from a point along a length of the corresponding side frame member 44, 46 (e.g., the second side frame member 46 in the view of FIG. 5). With this in mind, the foot 162 forms the upper surface 184 to be spaced below the second side frame member 46 (as well as below the trailing frame member 42). Thus, the upper surface 184, the shoulder 160, and the second side frame member 46 combine to define a gap 200 (referenced generally in FIG. 5). The gap 200 provides a highly convenient, protected area along which wiring 202 (e.g., east-west wiring) associated with the PV device 22 (as well as wiring from other PV modules 20 assembled in an array) can be placed without the cumbersome need to route wires under each PV module as is otherwise required with conventional designs. In this regard, the wiring 202 can be placed on to, and safely maintained by, the upper surface 184.

Figure 7:
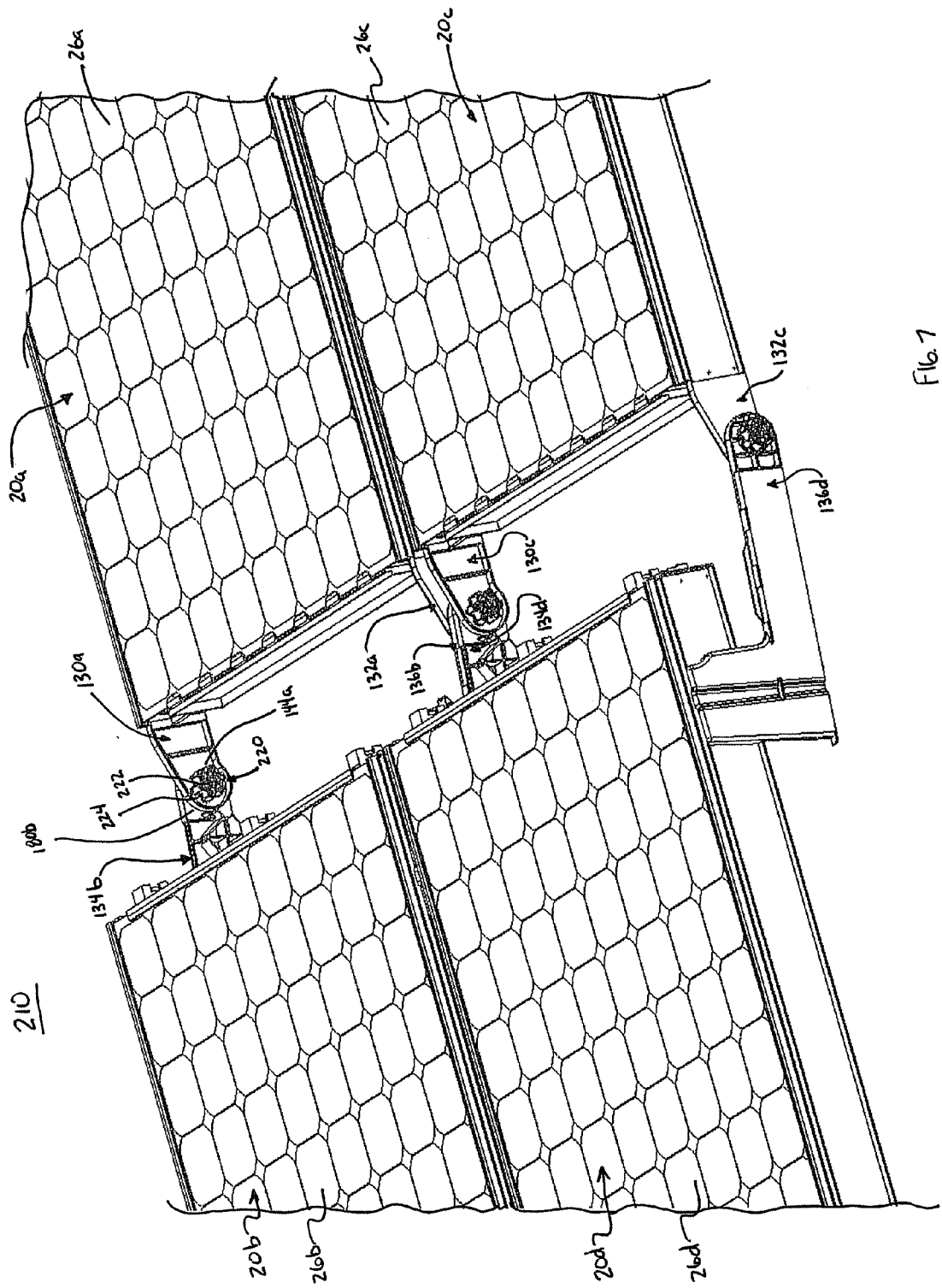
FIG. 7 is a top, perspective view of a portion of a photovoltaic module array in accordance with principles of the present disclosure.

Usefulness of the arm configurations described above in facilitating mounting of two or more of the PV modules 20 to one another can be described with reference to FIG. 7. In particular, FIG. 7 illustrates relevant portions of four, identically-constructed ones of the PV modules 20 in accordance with the present disclosure, including PV modules 20a-20d mounted in an array 210. The first and second PV modules 20a, 20b are mounted to one another in an end-to-end relationship, as are the third and fourth PV modules 20c, 20d. In addition, the first and third PV modules 20a, 20c are mounted to one another in a side-by-side relationship, as are the second and fourth PV modules 20b, 20d.

Mounting of the first and second PV modules 20a, 20b includes the first arm 130a of the first PV module 20a mounted to the third arm 134b of the second PV module 20b, and the second arm 132a of the first PV module 20a mounted to the fourth arm 136b of the second PV module 20b. Similar mounting relationships are established between the first arm 130c of the third PV module 20c and the third arm 134d of the fourth PV module 20d, as well as the second arm 132c and the fourth arm 136d. Finally, the fourth arm 136b of the second PV module 20b is mounted to the third arm 134c of the third PV module 20c.

To effectuate a more complete mounting between the respective arm pairs (e.g., the arms 130a/134b), a coupling device 220 (referenced generally) can be provided, for example including a bolt component 222 and a nut component 224. More particularly, upon arrangement of respective ones of the PV modules 20 in an end-to-end relationship (e.g., the first and second PV modules 20a, 20b), the mounting regions of the corresponding arm pairs (e.g., the mounting region 144a of the first arm 130a and the mounting region 180b (referenced generally) of the third arm 134b) are naturally or intuitively positioned by an installer such that the respective bores 146 (FIG. 1B), 190 (FIG. 3A) are aligned for commonly receiving the bolt 222. Further, the arms 130-136 are configured such that the bottom surface 152 of the first or second arm 130 or 132 is aligned or co-planar with the lower surface 182 of the corresponding third or fourth arm 134 or 136. For example, and with additional reference to FIG. 8, the bottom surface 152 of the second arm 132c of the third PV module 20c is aligned with the lower surface 182 of the fourth arm 136d of the fourth PV module 20d. Similar, aligned relationships are established at the other arm mounting interfaces, such as the arm mounting interface 130a/134b, 132a/136b, and 130c/134d. With this construction, then, in the mounted arrayed arrangement 210 of FIGS. 7 and 8, the PV laminates 26a-26d are all oriented at virtually identical tilt angles; the commonly, spatially positioned surfaces 152, 182 of the various arms 130-136 dictate that regardless of the number of PV modules 20 within the array 210 and regardless of the number of PV modules 20 mounted to an individual PV modules 20 (including a single, standing-alone PV module 20), desired tilted orientation of the corresponding PV laminates 26 in consistently provided with a straightforward installation process. Along these same lines, by interconnected the PV modules 20 to one another, the array 210 can quickly be installed on a rooftop without requiring rooftop-penetrating components or any specialty tools.

Figure 9B:
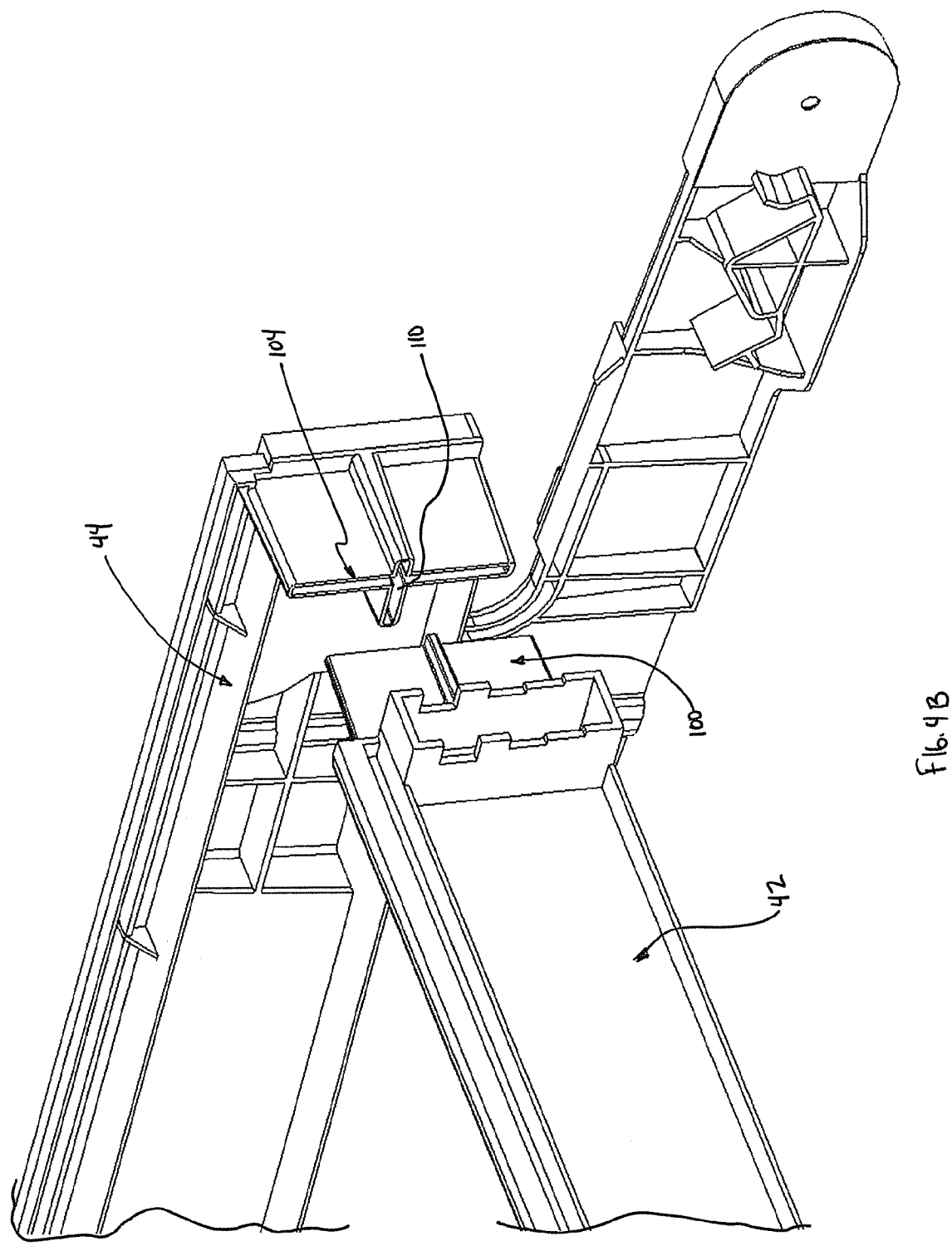
FIG. 9 is a top view of the array of FIG. 7.

The simplified array 210 is but one example of a PV module installation facilitated by the present disclosure. The PV module 20 constructions of the present disclosure allow for virtually any array installation configuration (e.g., in terms of number of PV modules 20 mounted to one another on a substantially flat commercial rooftop and/or overall "shape" or geometry of the resultant array). Regardless of the parameters of the desired array, the individual PV modules 20 are simply and quickly mounted to one another as described above, and can be placed at any location within the array. Thus, the PV module 20 has a universal configuration. East-west wiring (or other wiring) can be run "beneath" a line of mounted PV modules 20 as described above (e.g., in FIG. 5). Simplified, consistent arrangement of other wiring, such as "home run" wiring (e.g., north-south wiring or east-west wiring), is also facilitated by features of the PV modules 20 of the present disclosure. For example, as reflected in FIG. 9, that otherwise provides a top view of the array 210, the side-by-side arranged PV modules 20a, 20c and 20b, 20d define a longitudinal gap 230 relative to the corresponding PV laminates 26a-26d. More particularly, the above-described, laterally off-set position of the third and fourth arms 134, 136 of each of the PV modules 20 (e.g., the fourth arm 136b of the second PV module 20b and the third arm 134d of the fourth PV module 20d in FIG. 9) creates the longitudinal gap 230 when the PV modules 20 are disposed side-by-side. Wiring can be run along the longitudinal gap 230, maintained away from or "above" the rooftop surface by placement on the upper surface 184 associated with each of the arms 134, 136. For both east-west and north-south wiring, the above construction eliminates the need for time-consuming and cumbersome routing of wires underneath individual PV modules. Rather, the installer can simply walk along or through the array 210 and place wiring as necessary without needing to lift the PV modules 20 and/or routing wires under the PV modules 20.

As is evident from the above, the PV modules 20 of the present disclosure greatly simplify the rooftop installation process. Minimal on-site assembly is required in installing an array of tilted, non-penetrating PV solar tiles. An additional advantage is recognized in the context of upfront planning. Because the PV module 20 can effectively be installed (non-penetrating) "as is," the upfront installation planning process essentially entails the step of ordering the number of PV modules 20 determined to be necessary for a particular installation site. Unlike conventional commercial rooftop PV solar tile formats, installers of PV modules 20 of the present disclosure are not required to estimate the number and type of auxiliary installation component parts ahead of time and hope that the correct estimate is made (and that the correct component parts are actually delivered). In fact, each PV module 20 can be provided to the installation site in a kit form, including the PV module 20 and a standard number of the coupling devices 220 (FIG. 7) and, an optionally, a wind deflector. With this kitted form, the installer has all components necessary to install the PV module array, regardless of the number of PV modules 20 to be installed and/or the actual "shape" of the desired array. While it is recognized that some installation sites may require additional components (e.g., ballast), the desired quantities of these components are more readily estimated (as compared to auxiliary installation component parts with conventional tilted, non-penetrating rooftop PV solar tiles), such that upfront planning is greatly eased with the present disclosure. Further, the PV modules 20 can include optional features that facilitate assembly of the common components such as wind deflectors and/or ballast.

In addition to promoting simplified, rapid installation, features of the PV modules 20 of the present disclosure greatly reduce packaging and shipping expenses. Returning to FIGS. 1A and 1B, in some embodiments the frame 24 is formed entirely of plastic or polymeric material(s). For example, the frame 24, and in particular the frame members 40-46 and arms 130-136, are molded polymeric components, such as injection molded PPO/PS (Polyphenylene Oxide co-polymer/polystyrene blend) or PET (Polyethylene Terephthalate), although other polymeric or electrically insulating material (s) are also acceptable. The resultant PV module 20 is lightweight (e.g., on the order of 3 lbs/ft$^2$), and therefore relatively inexpensive to install and presents minimal rooftop loading concerns. Further, as compared to conventional PV module constructions that rely primarily upon metal framework and related installation components, the PV modules 20 of the present disclosure incorporating the optional non-conductive plastic frame 24 do not require additional grounding components (and related installation procedures). Alternatively, however, the frame 24 can be partially or entirely formed of metal.

Figure 10:
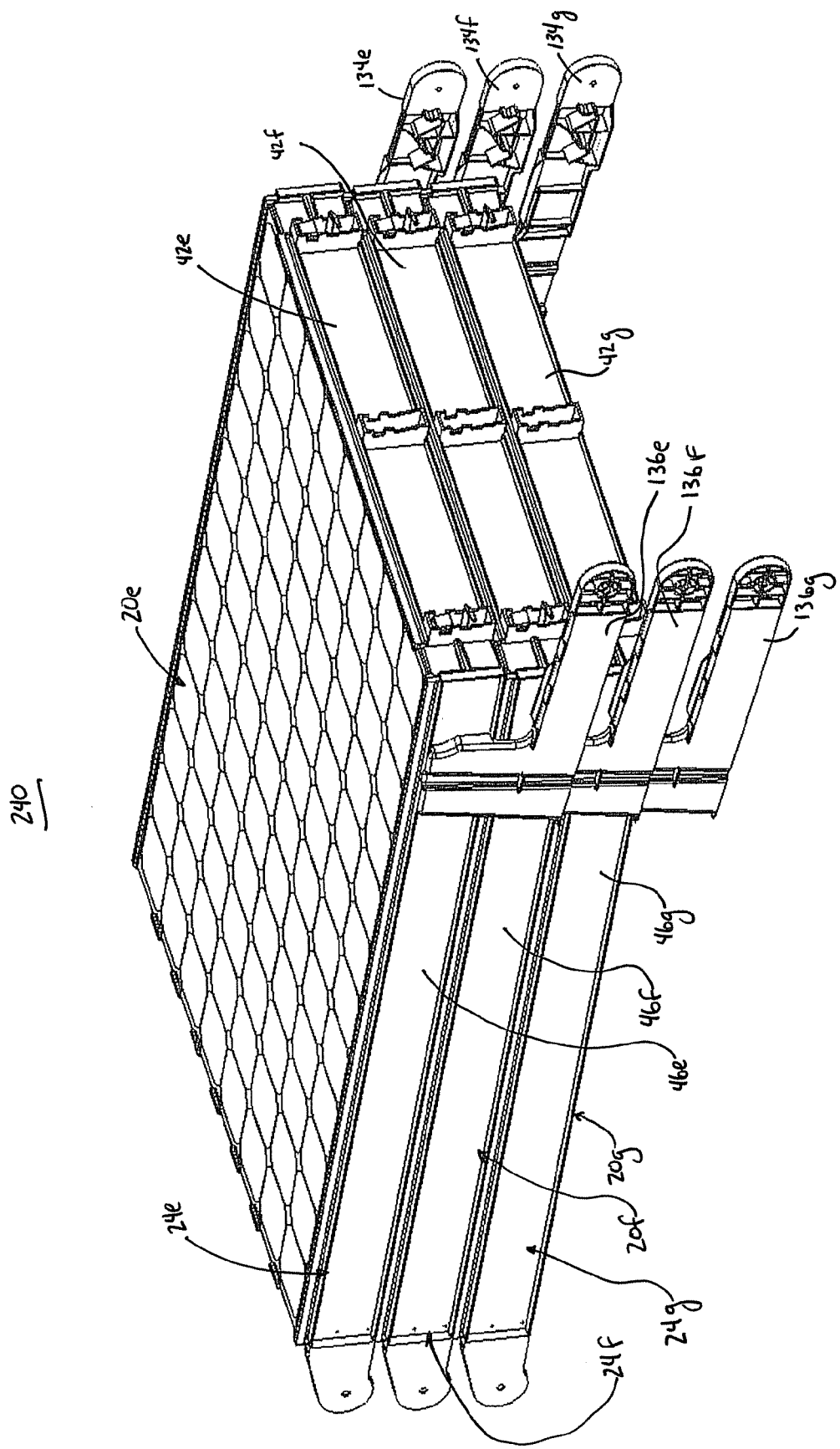
FIG. 10 is a rear perspective view of multiple ones of the modules of FIG. 1A provided as a stacked system.
Figure 11:
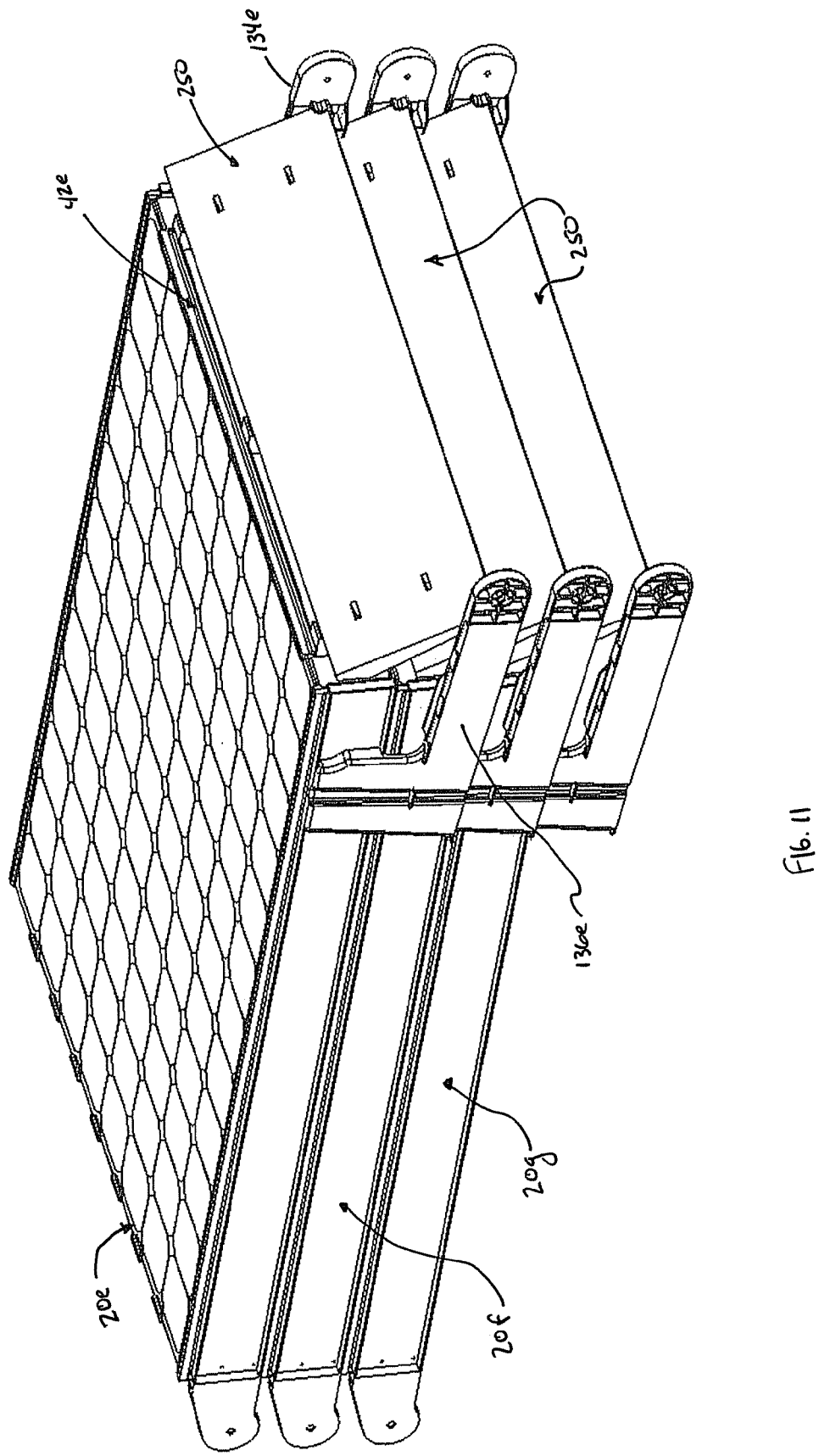
FIG. 11 is a rear perspective view of photovoltaic modules in accordance with the present disclosure stacked relative to one another and incorporating a wind deflector component.

Regardless of the material(s) used in forming the frame 24, identically formed ones of the PV modules 20 can be compactly arranged for shipping to an installation site. For example, FIG. 10 illustrates three of the PV modules 20e-20g of the present disclosure stacked in a nested arrangement as part of a kitted system 240. The frame members 40e-46e of the first PV module 20e abut against the corresponding frame members 40f-46f of the second PV module 20f (it being understood that the leading frame members 40 and the first side frame members 44 are hidden in the view of FIG. 10); a similar arrangement is established between the frame members 40f-46f of the second PV module 20f and the frame members 40g-46g of the third PV module 20g. The laterally off-set arrangement of the corresponding third and fourth arms 134, 136 promote this stacked assembly. For example, the third and fourth arms 134e, 136e of the first PV module 20e "clear" the frame 24f of the second PV module 20f in placing the frame 24e of the first PV module 20e onto the frame 20f of the second PV module 20f. Notably, the trough 170 associated with each of the third and fourth arms 134, 136 as described above with respect to FIG. 6 further promotes the stacked, nested arrangement of the PV modules 20e -20g. For example, the shoulder 160 of the fourth arm 136f of the second PV module 20f is slidably received within the trough 170 (hidden in FIG. 10) of the fourth arm 134e of the first PV module 20e . As a result, the PV modules 20 of the present disclosure can be closely stacked for high shipping density, thereby greatly minimizing shipping (and related packaging) waste and cost. Notably, this same, nested or stacked arrangement is also achieved with shipping formats including additional components such as a wind deflector 250 as shown in FIG. 11. More particularly, respective ones of the wind deflector 250 are assembled to each of the PV modules 20e -20g so as to extend between the corresponding trailing frame member 42 and third/fourth arms 134/136 (e.g., the wind deflector 250e is assembled to the trialing frame member 42e and the third/fourth arms 134e/136e of the first PV module 20e ) in a manner that does not impeded the desired, stacked arrangement in a kitted system.

The PV modules of the present disclosure provide a marked improvement over previous designs. The frame allows for simple, rapid, non-penetrating installation of a PV module array to a flat commercial rooftop, with the corresponding PV laminate desirably being arranged at a tilted orientation. Further, the unitary construction of the frame and PV device (and in particular the PV laminate) greatly reduces ordering, shipping, and handling steps and expenses in a manner not previously considered possible. In sum, the PV modules of the present disclosure address most, if not all, of the drawbacks associated with conventional non-penetrating, tilted PV solar tile installations, thereby enhancing market viability of this environmentally imperative energy technology.

Although the present disclosure has been described with reference to preferred embodiments, workers skilled in the art will recognize that changes can be made in form and detail without departing from the spirit and scope of the present disclosure. For example, while the frame has been described as including four of the arms, in other embodiments, a lesser or greater number can be provided. Along these same lines, while the various arms have been described as being formed as part of certain frame members (e.g., the side frame members), in other embodiments, one or more of the arms can project from (or be formed as part of) other(s) of the frame members.

What is claimed is:

1. A photovoltaic module for non-penetrating installation at a substantially flat surface, the photovoltaic module comprising:
   a photovoltaic device including a photovoltaic laminate having a perimeter and a front face defining a major plane; and
   a frame assembled to and encasing the perimeter of the photovoltaic laminate, the frame including:
      opposing, leading and trailing frame members,
      opposing, first and second side frame members,
      a first arm integral with and projecting from the first side frame member and forming a support face opposite the front face for placement against a separate installation surface, wherein a plane of the support face and the major plane of the photovoltaic laminate are non-parallel, and wherein the support face of the first arm extends beyond the trailing frame member in a direction opposite the leading frame member,
      a second arm projecting from the second side frame member and forming a support face extending beyond the trailing frame member,
      a third arm projecting from the first side frame member and forming a support face beyond the leading frame member; and
      a fourth arm projecting from the second side frame member and forming a support face beyond the leading frame member, wherein the support faces of the first-fourth arms are co-planar;
   wherein upon final assembly, the photovoltaic laminate and the frame combine to define a unitary structure.

2. The photovoltaic module of claim 1, wherein the frame is configured such that when the support face is placed on a flat surface, the major plane of the photovoltaic laminate is oriented at a non-parallel angle relative to the flat surface.

3. The photovoltaic module of claim 1, wherein the frame is configured such that when the support face is placed on a horizontal flat surface, the trailing frame member is vertically higher than the leading frame member.

4. The photovoltaic module of claim 1, wherein the major plane of the photovoltaic laminate and the plane of the support face combine to define an included angle in the range of 1°-30°.

5. The photovoltaic module of claim 4, wherein the included angle is in the range of 3°-7°.

6. The photovoltaic module of claim 1, wherein the unitary structure is configured such that the frame cannot be disassembled from the photovoltaic laminate without destroying at least one of the frame members.

7. The photovoltaic module of claim 1, further comprising an adhesive bonding the frame members to the photovoltaic laminate.

8. The photovoltaic module of claim 1, wherein the frame members are entirely formed of a polymeric material.

9. The photovoltaic module of claim 1, wherein the first arm is configured to permit stacking of the frame onto a corresponding frame of a second photovoltaic module assembly of identical construction.

10. The photovoltaic module of claim 9, wherein:
    the first side frame member defines:
       opposing, upper and lower surfaces, the photovoltaic laminate being located adjacent the upper surface,
       opposing, leading and trailing ends, an outer edge formed opposite the second side frame member; and the first arm includes a shoulder projecting from the first side frame member at an extension point adjacent the trailing end, an entirety of the shoulder below the lower surface and between the extension point and the trailing end being laterally spaced relative to the outer edge in a direction opposite the second side frame member.

11. The photovoltaic module of claim 1, wherein at least one of the frame members is I-shaped in cross-section.

12. The photovoltaic module of claim 1, wherein the first side frame member includes a first connector configured for press-fit assembly with a corresponding, second connector of the trailing frame member.

13. The photovoltaic module of claim 12, wherein:
the first connector is one of:
a female component defining a receptacle,
a male component having a shape corresponding with a shape of the receptacle; and
the second connector is another of the male and female components.

14. The photovoltaic module of claim 13, wherein the male component includes first and second segments, the segments intersecting one another and being approximately perpendicular.

15. The photovoltaic module of claim 13, wherein each of the frame members defines opposing, first and second ends and further including:
one of the female and male components at the first end; and
one of the female and male components at the second end.

16. The photovoltaic module of claim 1, wherein the first side frame member includes:
an elongate frame body; and
a C-shaped bracket extending from the frame body and forming a channel sized to receive the photovoltaic laminate.

17. The photovoltaic module of claim 16, wherein the bracket includes:
a lower surface proximate the frame body;
an upper surface opposite the frame body;
an end surface extending between the upper and lower surfaces;
wherein each of the upper and lower surfaces form an angle of not less than 91° in extension from the end surface.

18. The photovoltaic module of claim 16, wherein the first side frame member further includes:
a plurality of spaced tabs each forming a tapered guide surface from the frame body to the channel for facilitating insertion of the photovoltaic laminate into the channel.

19. The photovoltaic module of claim 1, wherein the frame further includes a mounting region carried at a terminating section of the first arm, the mounting region configured for assembly to a corresponding mounting region associated with the third arm of a second photovoltaic module of identical construction.

20. The photovoltaic module of claim 1, wherein upon placement of the support faces onto a separate installation surface, the support faces are below the frame members.

21. The photovoltaic module of claim 1, wherein the frame members and the arms are each entirely formed of a polymeric material.

22. The photovoltaic module of claim 1, wherein the arms are configured to permit stacking of the frame against the corresponding frame of a second photovoltaic module of identical construction.

23. A photovoltaic module system kit for non-penetrating installation at a substantially flat surface, the kit comprising:
first and second photovoltaic modules each including:
a photovoltaic device including a photovoltaic laminate, and
a frame assembled to and surrounding the photovoltaic laminate to define a unitary structure, the frame including an arm forming a planar support face for placement against a separate installation surface, the arm integral with the frame,
wherein the support face and the photovoltaic laminate are nonparallel;
wherein the kit is configured to provide a storage state in which the frame of the first photovoltaic module is placed against the frame of the second photovoltaic module such that the respective photovoltaic laminates are parallel, the arm of the first photovoltaic module being transversely off-set from the frame of the second photovoltaic module, wherein the storage state further includes the arm of the second photovoltaic module received within a trough of the arm of the first photovoltaic module.

24. The kit of claim 23, further comprising:
a first coupling device associated with the first photovoltaic module for mounting of the first photovoltaic module as part of a non-penetrating array; and
a second coupling device associated with the second photovoltaic module for mounting of the second photovoltaic module as part of a non-penetrating array;
wherein the first and second coupling devices are identical.

25. The photovoltaic module of claim 1, wherein the first arm is adapted to couple to a coupling site of an adjacent photovoltaic module.

26. The photovoltaic module of claim 25, wherein the coupling site of the adjacent photovoltaic module is an arm integral with a frame of the adjacent photovoltaic module.

27. A photovoltaic module for non-penetrating installation at a substantially flat surface, the photovoltaic module comprising:
a photovoltaic device including a photovoltaic laminate having a perimeter and a front face defining a major plane; and
a frame assembled to and encasing the perimeter of the photovoltaic laminate, the frame including:
opposing, leading and trailing frame members,
opposing, first and second side frame members, and
a first arm integral with and projecting from one of the frame members and forming a support face opposite the front face for placement against a separate installation surface, wherein a plane of the support face and the major plane of the photovoltaic laminate are nonparallel, and wherein the first arm is configured to permit stacking of the frame onto a corresponding frame of a second photovoltaic module assembly of identical construction, and wherein the first side frame member defines:
opposing, upper and lower surfaces, the photovoltaic laminate being located adjacent the upper surface,
opposing, leading and trailing ends,
an outer edge formed opposite the second side frame member, wherein the first arm includes a shoulder projecting from the first side frame member at an extension point adjacent the trailing end, an entirety of the shoulder below the lower surface and between the extension point and the trailing end being laterally spaced relative to the outer edge in a direction opposite the second side frame member;

wherein upon final assembly, the photovoltaic laminate and the frame combine to define a unitary structure.

28. The photovoltaic module of claim 27, wherein the frame is configured such that when the support face is placed on a flat surface, the major plane of the photovoltaic laminate is oriented at a non-parallel angle relative to the flat surface.

29. The photovoltaic module of claim 27, wherein the frame is configured such that when the support face is placed on a horizontal flat surface, the trailing frame member is vertically higher than the leading frame member.

30. The photovoltaic module of claim 27, wherein the unitary structure is configured such that the frame cannot be disassembled from the photovoltaic laminate without destroying at least one of the frame members.

31. The photovoltaic module of claim 27, wherein the first arm is adapted to couple to a coupling site of an adjacent photovoltaic module.

32. A photovoltaic module for non-penetrating installation at a substantially flat surface, the photovoltaic module comprising:
   a photovoltaic device including a photovoltaic laminate having a perimeter and a front face defining a major plane; and
   a frame assembled to and encasing the perimeter of the photovoltaic laminate, the frame including:
      opposing, leading and trailing frame members,
      opposing, first and second side frame members,
      a first arm integral with and projecting from one of the frame members and forming a support face opposite the front face for placement against a separate installation surface, wherein a plane of the support face and the major plane of the photovoltaic laminate are non-parallel, wherein the first side frame member includes a first connector configured for press-fit assembly with a corresponding, second connector of the trailing frame member;
   wherein upon final assembly, the photovoltaic laminate and the frame combine to define a unitary structure.

33. The photovoltaic module of claim 32, wherein:
the first connector is one of:
   a female component defining a receptacle,
   a male component having a shape corresponding with a shape of the receptacle; and
the second connector is another of the male and female components.

34. The photovoltaic module of claim 33, wherein the male component includes first and second segments, the segments intersecting one another and being approximately perpendicular.

35. The photovoltaic module of claim 33, wherein each of the frame members defines opposing, first and second ends and further including:
   one of the female and male components at the first end; and
   one of the female and male components at the second end.

36. The photovoltaic module of claim 32, wherein the first arm is adapted to couple to a coupling site of an adjacent photovoltaic module.

\* \* \* \* \*